(12) United States Patent
Motomura et al.

(10) Patent No.: US 8,434,665 B2
(45) Date of Patent: May 7, 2013

(54) ELECTRONIC COMPONENT MOUNTING SYSTEM AND ELECTRONIC COMPONENT MOUNTING METHOD

(75) Inventors: Koji Motomura, Osaka (JP); Hideki Eifuku, Osaka (JP); Tadahiko Sakai, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/255,986

(22) PCT Filed: Mar. 24, 2010

(86) PCT No.: PCT/JP2010/002085
§ 371 (c)(1),
(2), (4) Date: Sep. 12, 2011

(87) PCT Pub. No.: WO2010/116636
PCT Pub. Date: Oct. 14, 2010

(65) Prior Publication Data
US 2012/0012645 A1    Jan. 19, 2012

(30) Foreign Application Priority Data

Apr. 7, 2009  (JP) ................................. 2009-092617

(51) Int. Cl.
  *B23K 31/00*  (2006.01)
  *B23K 31/02*  (2006.01)
(52) U.S. Cl.
  USPC ..................... 228/179.1; 228/178; 228/180.1; 228/180.21; 228/180.22; 228/245
(58) Field of Classification Search ..... 228/178–180.22, 228/245–255, 37
See application file for complete search history.

(56) References Cited

U.S. PATENT DOCUMENTS

| | | | |
|---|---|---|---|
| 2007/0090171 A1* | 4/2007 | Ochiai et al. | 228/225 |
| 2008/0202804 A1 | 8/2008 | Fakutomi et al. | |
| 2009/0075025 A1 | 3/2009 | Ozono et al. | |
| 2009/0250313 A1* | 10/2009 | Kimura et al. | 198/465.1 |

(Continued)

FOREIGN PATENT DOCUMENTS

| | | |
|---|---|---|
| JP | 2007-149815 A | 6/2007 |
| JP | 2007-194249 A | 8/2007 |

(Continued)

OTHER PUBLICATIONS

International Search Report for PCT/JP2010/002085 dated Apr. 20, 2010.

*Primary Examiner* — Erin Saad
(74) *Attorney, Agent, or Firm* — Pearne & Gordon LLP

(57) ABSTRACT

Disclosed are an electronic component mounting system and an electronic component mounting method capable of reducing the space occupied by equipment and equipment cost and ensuring high connection reliability. An electronic component mounting system (1) includes a solder printing device (M1), a coating/inspection device (M2), a component mounting device (M3), a bonding material supply/substrate mounting device (M4), and a reflow device (M5). The electronic component mounting system (1) mounts an electronic component on a main substrate (4) and connects a module substrate (5) to the main substrate (4). A cream solder is printed on the main substrate (4) to mount an electronic component, a bonding material in which solder particles are contained in thermosetting resin is supplied to a first connection portion of the main substrate (4), and a second connection portion of the module substrate (5) is landed on the first connection portion through the bonding material. Thereafter, the main substrate (4) is carried in the reflow device (M5) and heated in the same reflow step to solder-bond the electronic component onto the main substrate (4) and to bond the second connection portion of the module substrate (5) and the first connection portion of the main substrate (4) together by the bonding material.

3 Claims, 19 Drawing Sheets

U.S. PATENT DOCUMENTS

2010/0018048 A1 * 1/2010 Sakai et al. .................. 29/832

FOREIGN PATENT DOCUMENTS

| | | | |
|---|---|---|---|
| JP | 2007-324473 A | 12/2007 | |
| JP | 2008-140718 A | 6/2008 | |
| JP | 2008-166488 A | 7/2008 | |
| JP | 2008-210993 A | 9/2008 | |

* cited by examiner

ELECTRONIC COMPONENT MOUNTING SYSTEM AND ELECTRONIC COMPONENT MOUNTING METHOD

TECHNICAL FIELD

The present invention relates to an electronic component mounting system which has a plurality of devices for electronic component mounting connected in series with each other, mounts an electronic component on a first substrate, and connects the first substrate and a second substrate with an electronic component mounted thereon in advance, and an electronic component mounting method in the electronic component mounting system.

BACKGROUND ART

In general, an electronic apparatus, such as a mobile phone, which should have a small size and high performance uses a configuration in which each functional module, such as a CCD camera or a display panel, is connected to a main electronic circuit module provided on a rigid substrate through a filmlike flexible substrate. As a method which connects terminals provided in the flexible substrate to circuit electrodes of the rigid substrate, a method is heretofore used in which electrical conduction is provided between the terminals and the circuit electrodes using an anisotropic conductive adhesive in which conductive particles are contained in thermosetting resin (for example, see PTL 1). In the patent literature example, solder particles are used as the conductive particles, the flexible substrate and the rigid substrate are bonded to each other by thermosetting resin, and the terminals of the flexible substrate are solder-bonded to the circuit board of the rigid substrate to provide electrical conduction.

CITATION LIST

Patent Literature

PTL 1: Japanese Unexamined Patent Application Publication No. 2008-140718

SUMMARY OF INVENTION

Technical Problem

However, in the related art including the above-described patent literature example, there are the following problems due to the step configuration. That is, in the related art, a component mounting step of mounting an electronic component on a rigid substrate and a substrate connection step of connecting a flexible substrate to the rigid substrate on which component mounting is completed are individually performed as individual steps. For this reason, it is necessary to further provide a plurality of mounting lines and an equipment which stacks the rigid substrate as an intermediate product with the component mounted thereon and conveys the rigid substrate to a mounting line for substrate connection, causing an increase in space occupied by equipment and equipment cost. In the component mounting step, the rigid substrate after the reflow ends is stacked until the substrate connection step is performed, and moisture absorption of the rigid substrate occurs during the stacking time. For this reason, in the substrate connection step of the rigid substrate and the flexible substrate, moisture is evaporated and a void is easily generated in the connection portion, causing degradation of connection reliability.

Accordingly, an object of the invention is to provide an electronic component mounting system and an electronic component mounting method capable of reducing the space occupied by equipment and equipment cost and ensuring high connection reliability.

Solution to Problem

The invention provides an electronic component mounting system which has a plurality of devices for electronic component mounting connected in series with each other, mounts an electronic component on a first substrate, and connects the first substrate and a second substrate to each other. The plurality of devices for electronic component mounting include a solder printing device which prints paste for solder bonding on the first substrate, a component mounting device which mounts the electronic component on the first substrate with the paste printed thereon, a bonding material supply device which supplies a bonding material, in which solder particles are contained in thermosetting resin, to a first connection portion provided in the first substrate, a substrate mounting device which mounts the second substrate on the first substrate to land a second connection portion provided in the second substrate on the first connection portion through the bonding material, and a reflow device which heats the first substrate with the electronic component and the second substrate mounted thereon to solder-bond the electronic component onto the first substrate and to bond the second connection portion and the first connection portion together by the bonding material.

The invention also provides an electronic component mounting system which has a plurality of devices for electronic component mounting connected in series with each other, mounts an electronic component on a first substrate, and connects the first substrate and a second substrate to each other. The plurality of devices for electronic component mounting include a solder printing device which prints paste for solder bonding on the first substrate, a bonding material supply device which supplies a bonding material, in which solder particles are contained in thermosetting resin, to a first connection portion of the first substrate with the paste printed thereon, a component mounting device which mounts the electronic component on the first substrate with the paste printed thereon, a substrate mounting device which mounts the second substrate on the first substrate to land a second connection portion provided in the second substrate on the first connection portion through the solder bonding material, and a reflow device which heats the first substrate with the electronic component and the second substrate mounted thereon to solder-bond the electronic component onto the first substrate and to bond the second connection portion and the first connection portion together by the bonding material.

The invention also provides an electronic component mounting system which has a plurality of devices for electronic component mounting connected in series with each other, mounts an electronic component on a first substrate, and connects the first substrate and a second substrate to each other. The plurality of devices for electronic component mounting include a solder printing device which prints paste for solder bonding on the first substrate, a bonding material supply device which supplies a bonding material, in which solder particles are contained in thermosetting resin, to a first connection portion provided in the first substrate, a mounting device which mounts the electronic component on the first substrate with the paste printed thereon and the bonding material supplied thereto, and mounts the second substrate on the first substrate to land a second connection portion provided in the second substrate on the first connection portion through the bonding material, and a reflow device which heats the first substrate with the electronic component and the second substrate mounted thereon to solder-bond the electronic component onto the first substrate and to bond the second connection portion and the first connection portion together by the bonding material.

The invention also provides an electronic component mounting method which mounts an electronic component on a first substrate and connects the first substrate and a second substrate to each other. The method includes a solder printing step of printing paste for solder bonding on the first substrate, a component mounting step of mounting the electronic component on the first substrate with the paste printed thereon, a bonding material supply step of supplying a bonding material, in which solder particles are contained in thermosetting resin, to a first connection portion provided in the first substrate, a substrate mounting step of mounting the second substrate on the first substrate to land a second connection portion provided in the second substrate on the first connection portion through the bonding material, and a reflow step of heating the first substrate with the electronic component and the second substrate mounted thereon to solder-bond the electronic component onto the first substrate and to bond the second connection portion and the first connection portion together by the bonding material.

The invention also provides an electronic component mounting method which mounts an electronic component on a first substrate and connects the first substrate and a second substrate to each other. The method includes a solder printing step of printing paste for solder bonding on the first substrate, a bonding material supply step of supplying a bonding material, in which solder particles are contained in thermosetting resin, to a first connection portion provided in the first substrate after the paste is printed, a component mounting step of mounting the electronic component on the first substrate with the bonding material supplied thereto, a substrate mounting step of mounting the second substrate on the first substrate to land a second connection portion provided in the second substrate on the first connection portion through the solder bonding material, and a reflow step of heating the first substrate with the electronic component and the second substrate mounted thereon to solder-bond the electronic component onto the first substrate and to bond the second connection portion and the first connection portion together by the bonding material.

The invention also provides an electronic component mounting method which mounts an electronic component on a first substrate and connects the first substrate and a second substrate to each other. The method includes a solder printing step of printing paste for solder bonding on the first substrate, a bonding material supply step of supplying a bonding material, in which solder particles are contained in thermosetting resin, to a first connection portion provided in the first substrate after the paste is printed, a mounting step of mounting the electronic component on the first substrate with the paste for solder bonding printed thereon and the bonding material supplied thereto and mounting the second substrate on the first substrate to land a second connection portion provided in the second substrate on the first connection portion through the bonding material, and a reflow step of heating the first substrate with the electronic component and the second substrate mounted thereon to solder-bond the electronic component onto the first substrate and to bond the second connection portion and the first connection portion together by the bonding material.

Advantageous Effects of Invention

According to the invention, in the electronic component mounting method which mounts the electronic component on the first substrate and connects the first substrate and the second substrate to each other, the paste for solder bonding is printed on the first substrate to mount the electronic component. The bonding material in which the solder particles are contained in thermosetting resin is supplied to the first connection portion provided in the first substrate to land the second connection portion provided in the second substrate on the first connection portion provided in the first substrate through the bonding material. Thereafter, the first substrate with the electronic component and the second substrate mounted thereon is heated in the same reflow step to solder-bond the electronic component onto the first substrate and to bond the second connection portion and the first connection portion together by the bonding material. Therefore, it becomes possible to reduce the space occupied by equipment and equipment cost and to connect the first substrate with the electronic component mounted thereon to the second substrate immediately without stacking the first substrate, thereby ensuring high connection reliability.

DESCRIPTION OF EMBODIMENTS (Embodiment 1)

Figure 1:
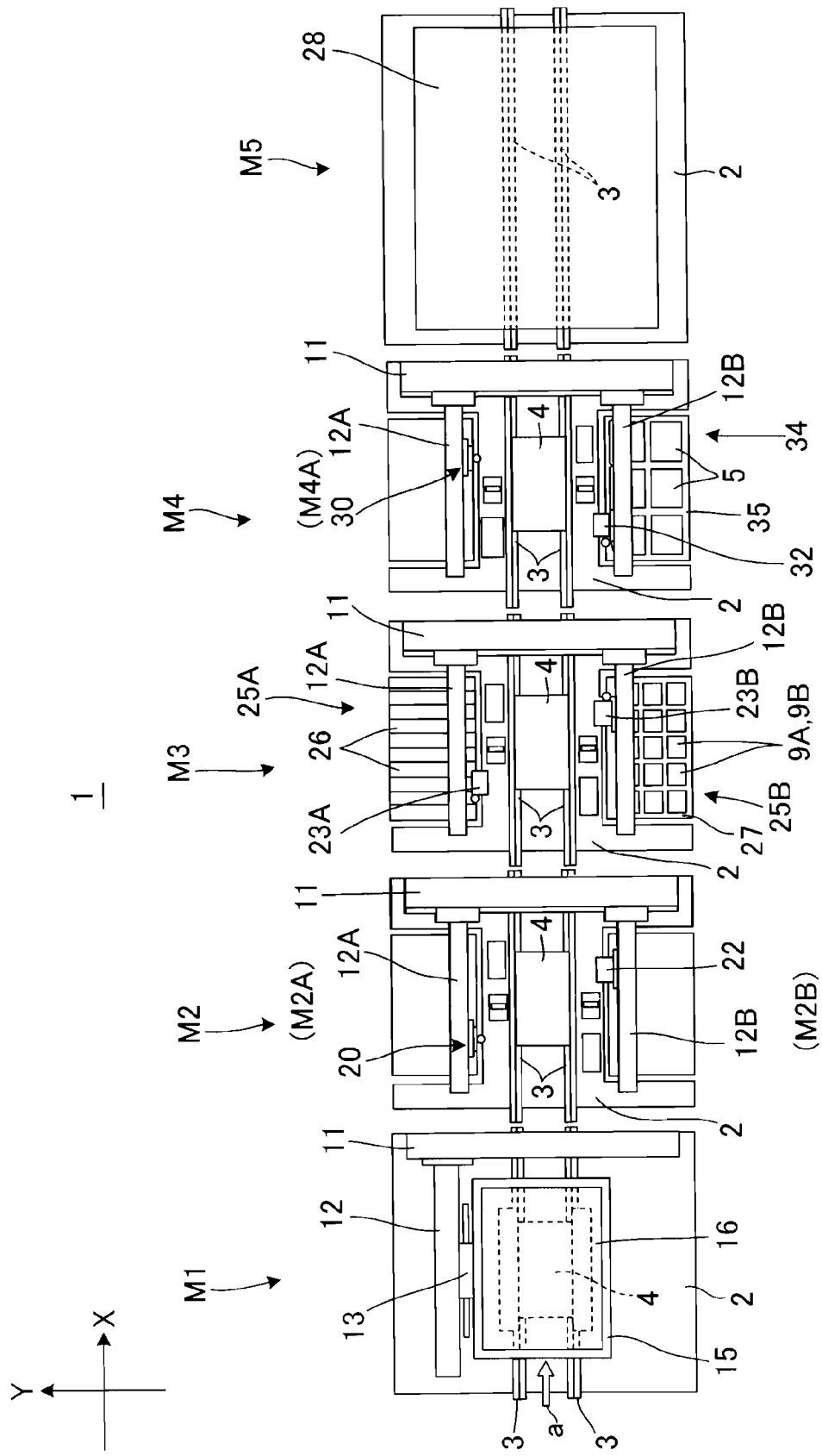
FIG. 1 is a plan view showing the configuration of an electronic component mounting system according to Embodiment 1 of the invention.

FIG. 1 is a plan view showing the configuration of an electronic component mounting system according to Embodiment 1 of the invention.

Figure 2:
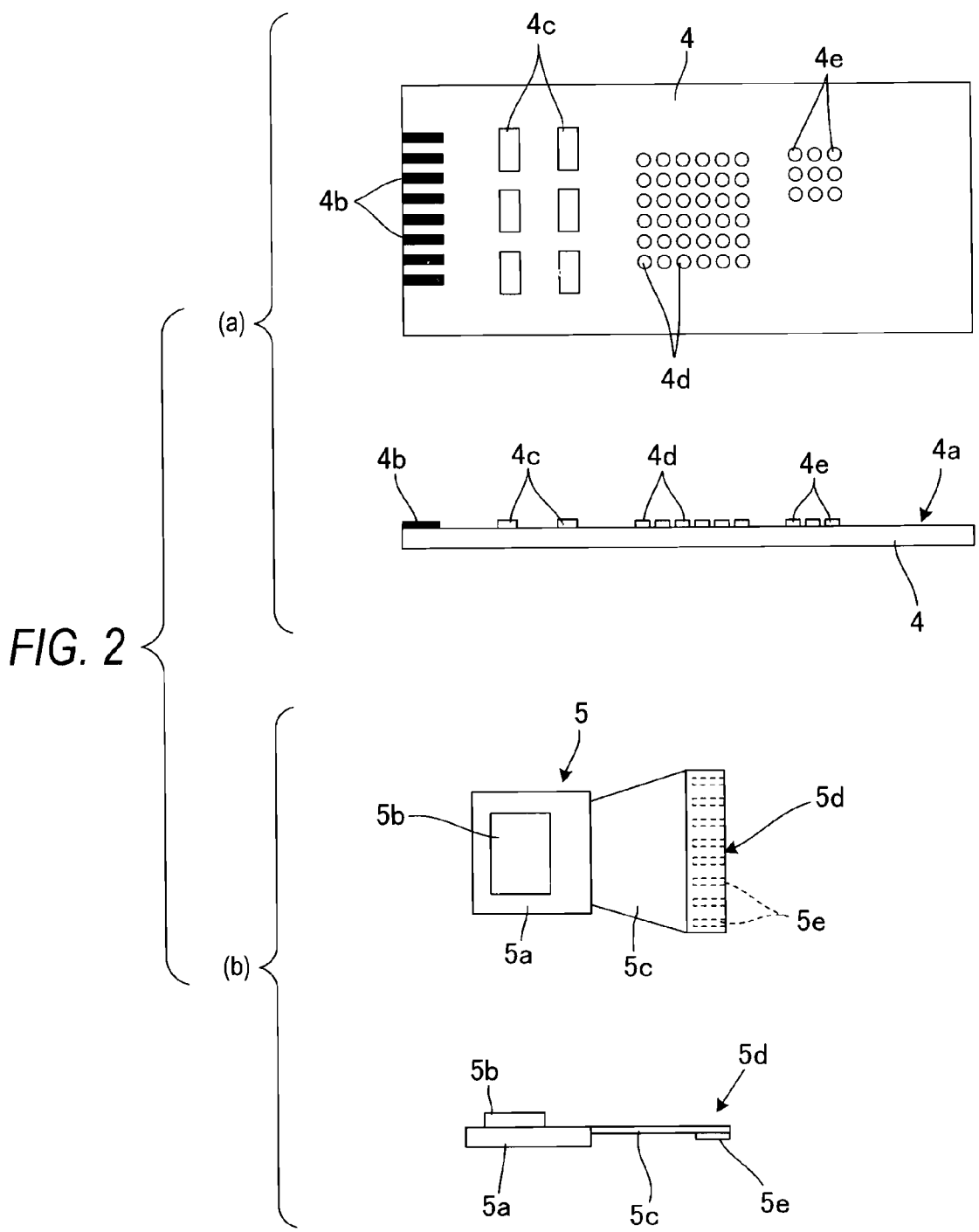
FIGS. 2(a) and (b) are explanatory views of a substrate as a mounting target of the electronic component mounting system according to Embodiment 1 of the invention.

FIG. 2 is an explanatory view of a substrate as a test target of the electronic component mounting system according to Embodiment 1 of the invention.

Figure 3:
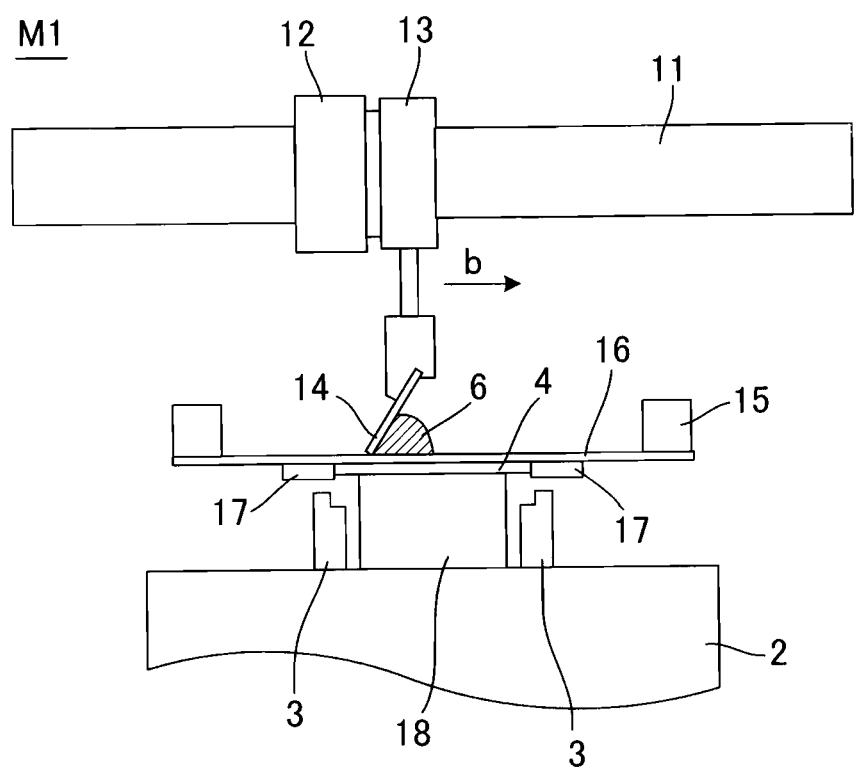
FIG. 3 is a partial sectional view of a solder printing device which constitutes the electronic component mounting system according to Embodiment 1 of the invention.
Figure 4:
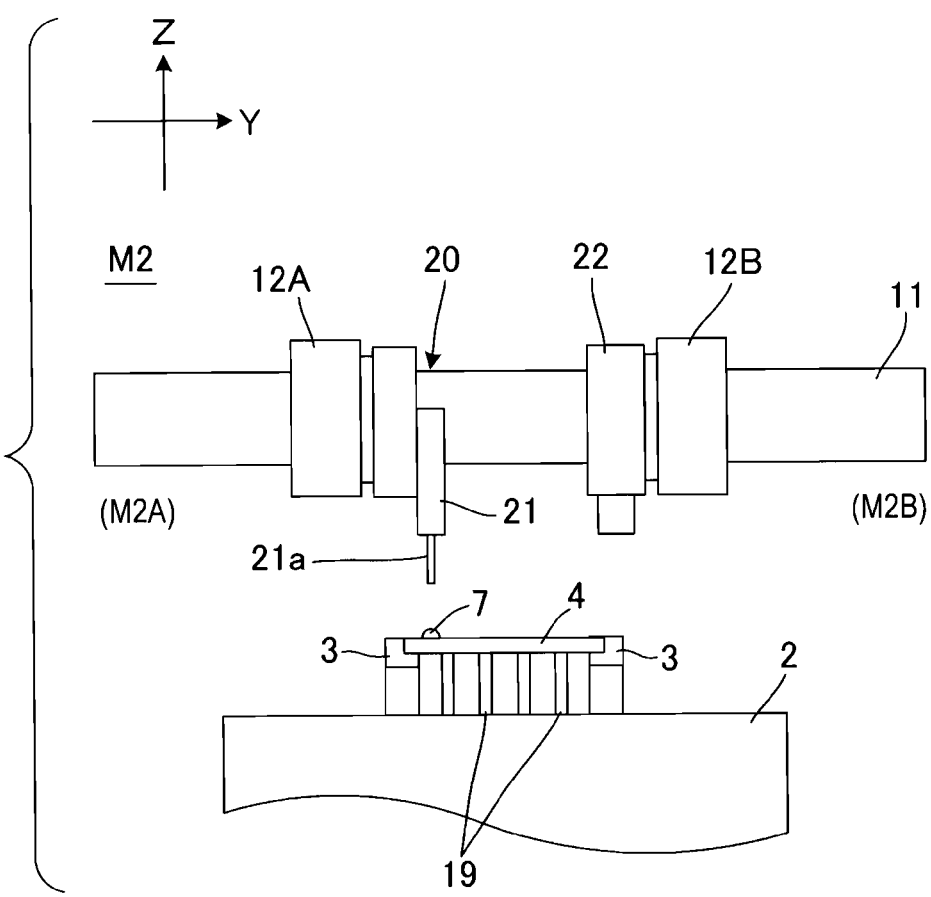
FIG. 4 is a partial sectional view of a coating/inspection device which constitutes the electronic component mounting system according to Embodiment 1 of the invention.
Figure 5:
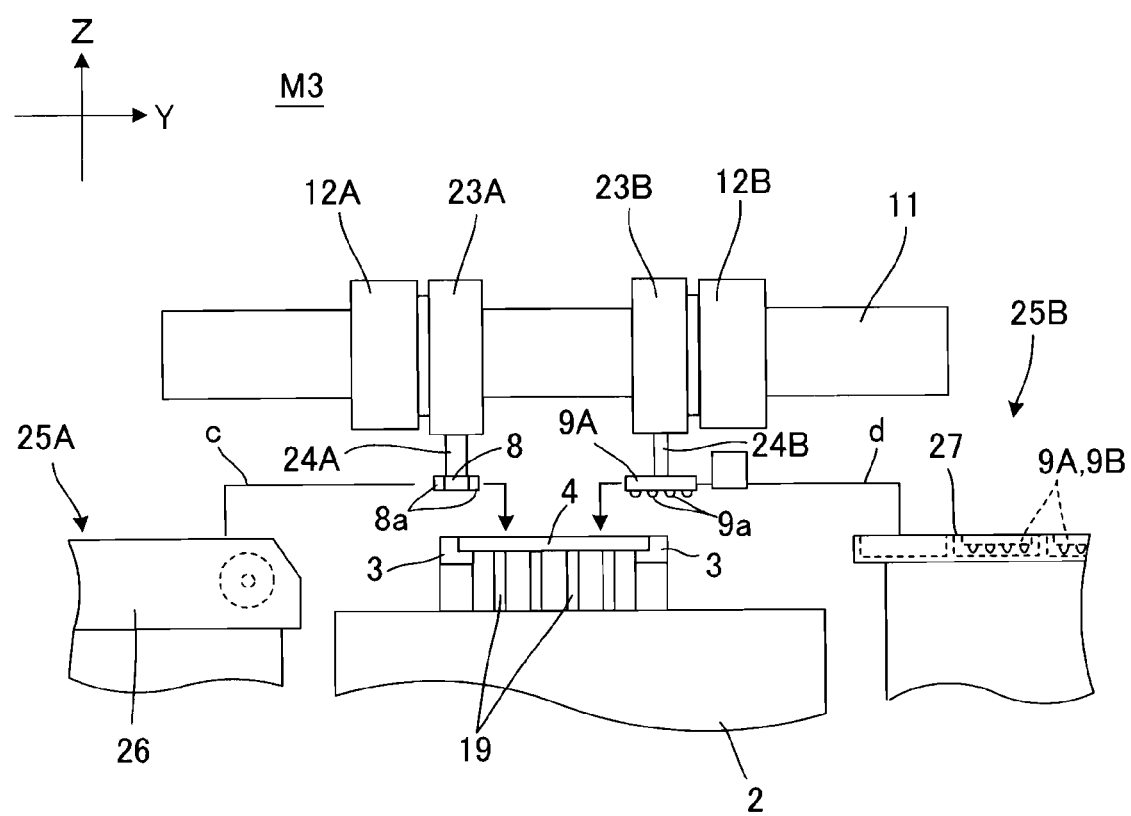
FIG. 5 is a partial sectional view of a component mounting device which constitutes the electronic component mounting system according to Embodiment 1 of the invention.

FIG. 3 is a partial sectional view of a solder printing device which constitutes the electronic component mounting system according to Embodiment 1 of the invention. FIG. 4 is a partial sectional view of a coating/inspection device which constitutes the electronic component mounting system according to Embodiment 1 of the invention. FIG. 5 is a partial sectional view of a component mounting device which constitutes the electronic component mounting system according to Embodiment 1 of the invention.

Figure 6:
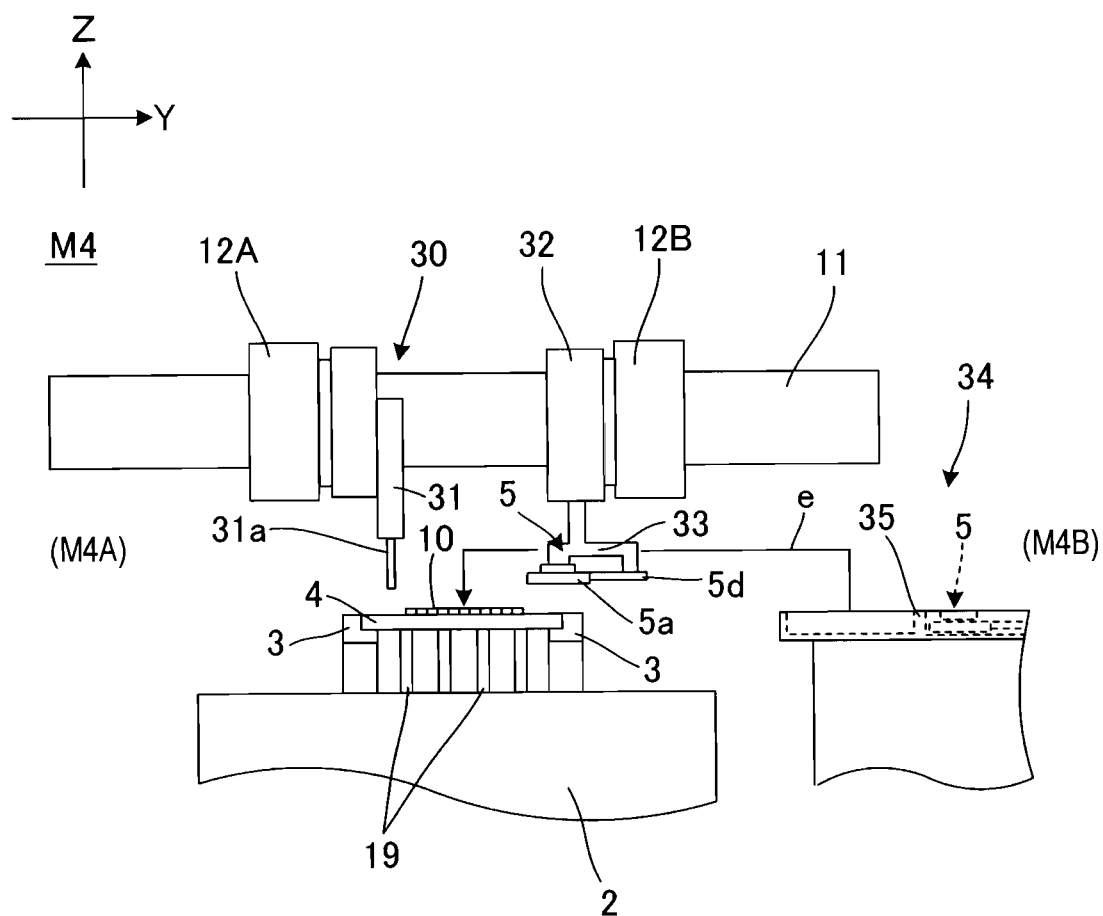
FIG. 6 is a partial sectional view of a bonding material supply/substrate mounting device which constitutes the electronic component mounting system according to Embodiment 1 of the invention.
Figure 11:
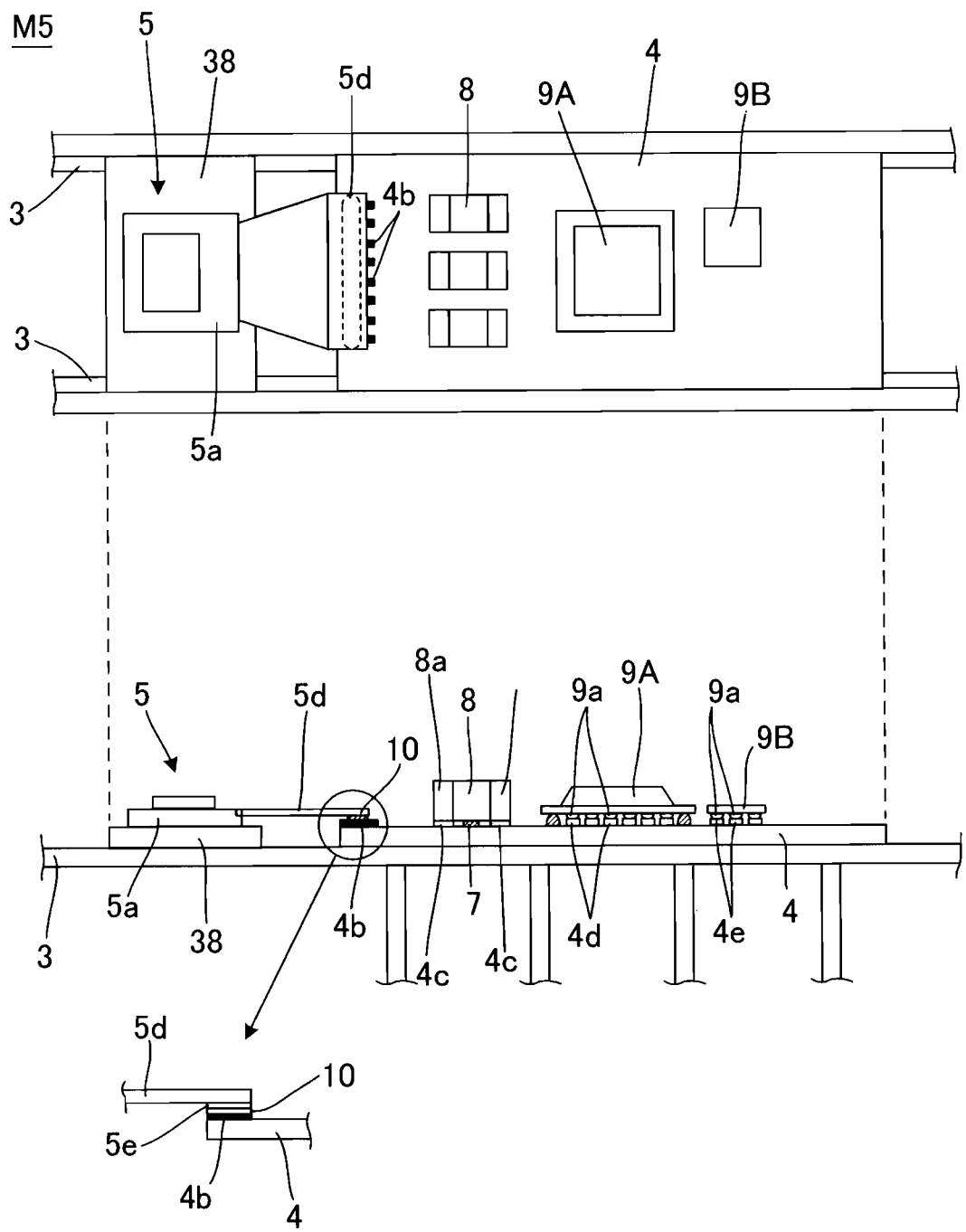
FIG. 11 is a process explanatory view of the electronic component mounting method in the electronic component mounting system according to Embodiment 1 of the invention.
Figure 12:
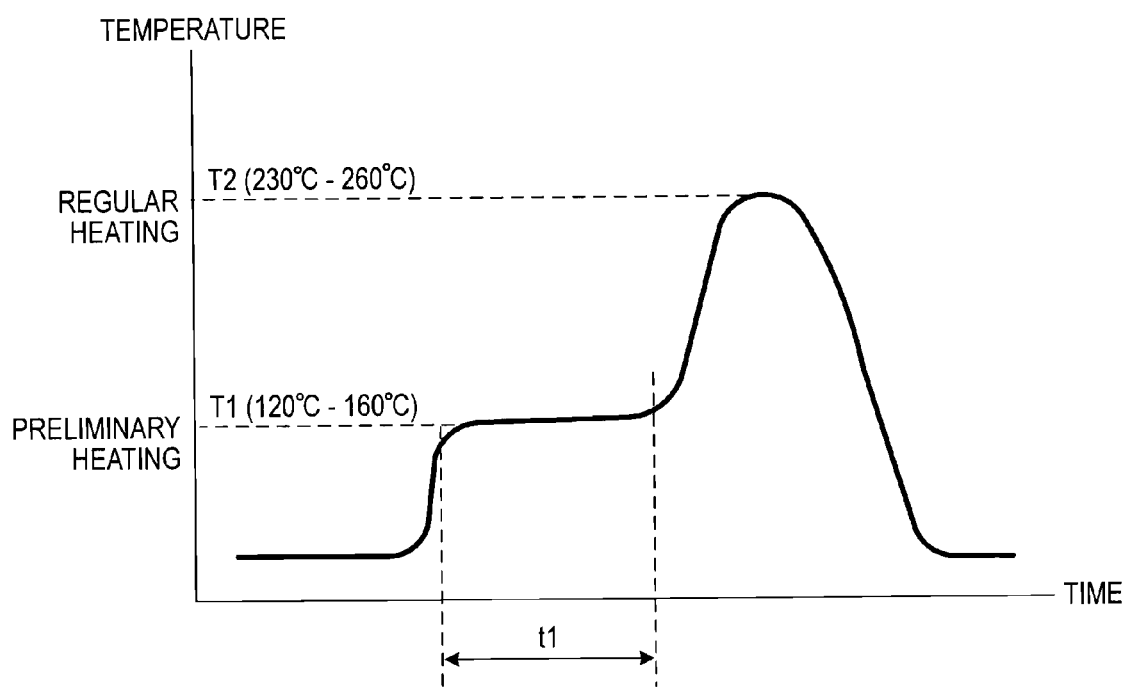
FIG. 12 is a diagram showing a heating profile of a reflow process in the electronic component mounting system according to Embodiment 1 of the invention.
Figure 13:
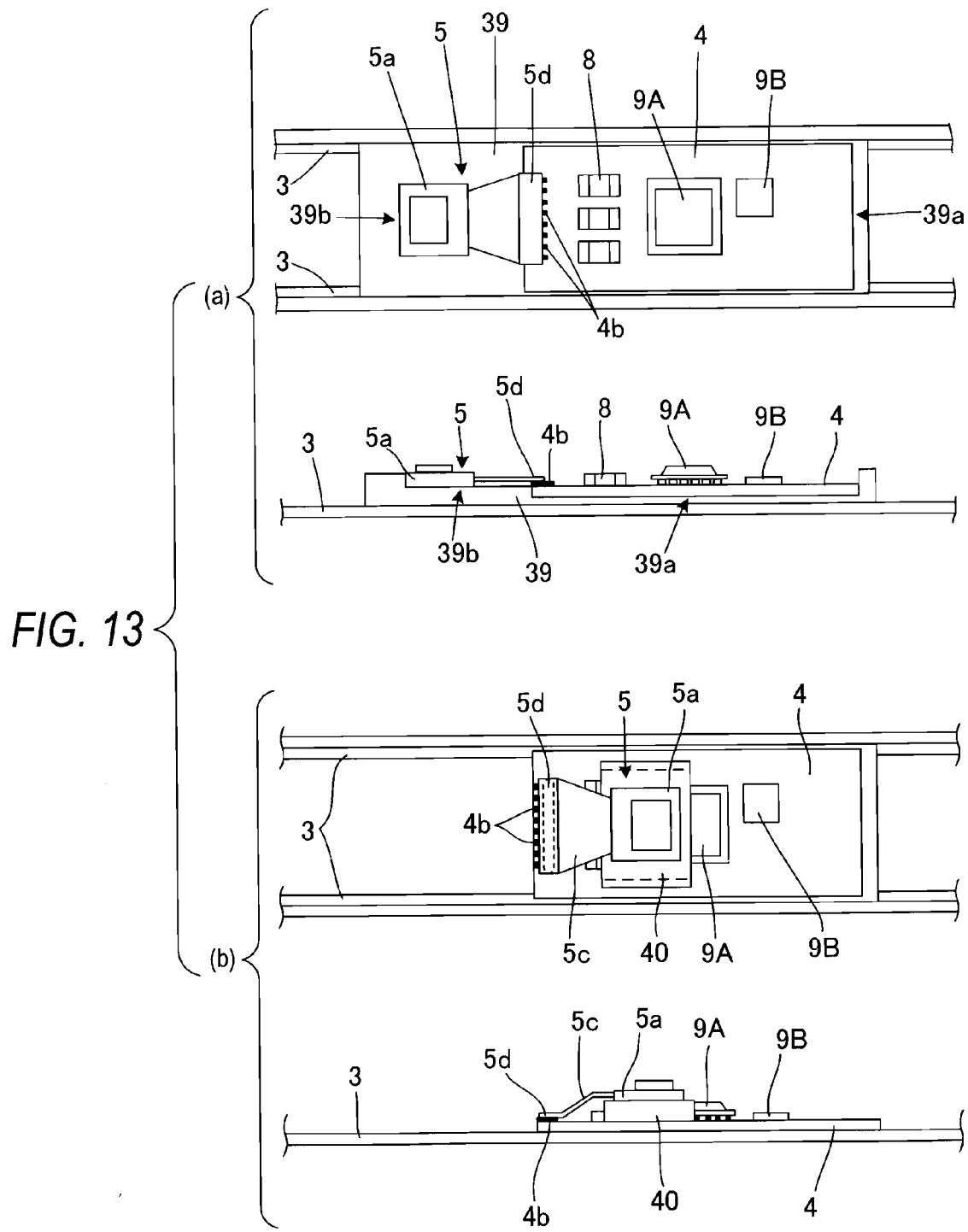
FIGS. 13(a) and (b) are explanatory views of a substrate support method in the electronic component mounting method according to Embodiment 1 of the invention.

FIG. 6 is a partial sectional view of a bonding material supply/substrate mounting device which constitutes the electronic component mounting system according to Embodiment 1 of the invention. FIGS. 7, 8, 9, 10, and 11 are process explanatory views of an electronic component mounting method in the electronic component mounting system according to Embodiment 1 of the invention. FIG. 12 is a diagram showing a heating profile of a reflow process in the electronic component mounting method according to Embodiment 1 of the invention. FIG. 13 is an explanatory view of a substrate support method in the electronic component mounting method according to Embodiment 1 of the invention.

First, the configuration of an electronic component mounting system 1 will be described with reference to FIG. 1. The electronic component mounting system 1 has a solder printing device M1, a coating/inspection device M2, a component mounting device M3, a bonding material supply/substrate mounting device M4, and a reflow device M5 connected in series with each other as a plurality of devices for electronic component mounting. Each device includes a substrate conveying mechanism 3 which is arranged in the X direction (substrate conveying direction) in the central portion of a base 2, and the substrate conveying mechanism 3 of each device is connected in series with the substrate conveying mechanism 3 of an adjacent device to form a substrate conveying path which passes through the electronic component mounting system 1 vertically. A main substrate 4 on which an electronic component will be mounted is sequentially carried in the substrate conveying mechanism 3 of the solder printing device M1 from the upstream side (the left side of FIG. 1, see arrow a) and sequentially conveyed in the X direction inside the electronic component mounting system 1.

Next, a main substrate 4 and a module substrate 5 as an operation target of the electronic component mounting system 1 will be described with reference to FIG. 2. FIG. 2(a) shows the main substrate 4 (first substrate) on which an electronic component will be mounted. A module substrate 5 (second substrate) shown in FIG. 2(b) is connected to the main substrate 4. The main substrate 4 and the module substrate 5 constitute an electronic circuit of a small terminal apparatus, such as a mobile phone, and are mounted in a casing in a state where the module substrate 5 is connected to the main substrate 4.

The main substrate 4 is made of glass epoxy resin. As shown in FIG. 2(a), a plurality of connection terminals 4b (first connection portion) which are located at one edge and used to connect the module substrate 5 are formed in a mounting surface 4a of the main substrate 4. In the central portion of the mounting surface 4a, electrodes 4c, 4d, and 4e to which the terminals of an electronic component will be connected are formed. Terminals 8a formed in the end portions of a chip-type component 8 and bumps 9a formed in the lower surfaces of bump-equipped components 9A and 9B are respectively solder-bonded to the electrodes 4c, 4d, and 4e (see FIGS. 8 and 9). FIG. 2(b) shows the module substrate 5. The module substrate 5 has a configuration in which a flexible substrate 5c is connected in advance to a sub substrate 5a on which an electronic component a for a driver is mounted in advance. In the lower surface of a connection end portion 5d of the flexible substrate 5c, flexible terminals 5e (second connection portion) which will be connected to the connection terminal 4b of the main substrate 4 are formed.

Next, the structure and functions of each device will be described. First, the solder printing device M1 will be described with reference to FIGS. 1 and 3. The solder printing device M1 has a function of printing a cream solder as paste for solder bonding on the main substrate 4. As shown in FIG. 3, a substrate conveying mechanism 3 is provided with a substrate underhung portion 18 which is movable up and down, and a mask plate 16 which is extended to a mask frame 15 is provided above the substrate conveying mechanism 3. The main substrate 4 conveyed from the upstream side by the substrate conveying mechanism 3 comes into contact with the lower surface of the mask plate 16 in a state where the lower surface of the main substrate 4 is underhung by the substrate underhung portion 18 and the main substrate 4 is further clamped from both sides by a clamp member 17.

In the end portion of a base 2 in the X direction, a Y-axis table 11 is arranged in the Y direction. If the Y-axis table 11 is driven, an X-axis beam 12 mounted on the Y-axis table 11 reciprocates in the Y direction. A skew unit 13 having a skew member 14 is mounted in the lower end portion of the X-axis beam 12. If the skew unit 13 is driven, the skew member 14 moves up and down, and in a state where the skew member 14 moves down, the lower end portion of the skew member 14 comes into contact with the upper surface of the mask plate 16. A cream solder 6 is supplied onto the mask plate 16, and in a state where the skew member 14 further moves down, the Y-axis table 11 is driven to move the skew unit 13 in the Y direction (arrow b). Thus, the cream solder 6 is printed on the electrodes 4c, 4d, and 4e provided in the main substrate 4 through pattern holes (not shown) provided to correspond to the electrodes 4c, 4d, and 4e in the mask plate 16 (see FIG. 7).

Next, the coating/inspection device M2 will be described with reference to FIGS. 1 and 4. The coating/inspection device M2 has a function of inspecting the printed state of the cream solder 6 printed on the main substrate 4 by the solder printing device M1 and coating an adhesive 7 for temporary component fixing on the main substrate 4. As shown in FIG. 4, a substrate conveying mechanism 3 is provided with a substrate underhung pin 19 which is movable up and down. The lower side of the main substrate 4 conveyed from the upstream side by the substrate conveying mechanism 3 is underhung by the substrate underhung pin 19. Above the substrate conveying mechanism 3 are provided an adhesive coating unit 20 which is movable in the X direction by a first X-axis table 12A and an inspection unit 22 which is movable in the X direction by a second X-axis table 12B.

In the adhesive coating unit 20, a dispenser 21 having a coating nozzle 21a in the lower end portion is mounted to be movable up and down. In a state where the dispenser 21 moves down and the coating nozzle 21a comes close to the upper surface of the main substrate 4, an ejection mechanism embedded in the dispenser 21 is activated, such that an adhesive 7 is ejected from the coating nozzle 21a and coated on the main substrate 4. The inspection unit 22 has a function of imaging the main substrate 4 therebelow, and performs recognition processing on the imaging result by a recognition processing section (not shown) to inspect the printed state of the cream solder 6 printed on the main substrate 4 or the coated state of the adhesive 7.

In the end portion of a base 2 in the X-direction, a Y-axis table 11 is arranged in the Y direction, and a first X-axis table 12A and a second X-axis table 12B are individually mounted on the Y-axis table 11 to be movable in the Y direction. If the Y-axis table 11 is driven, the first X-axis table 12A and the second X-axis table 12B reciprocate individually in the Y direction. The movement in the Y direction and the movement in the X direction by the first X-axis table 12A and the second X-axis table 12B are combined, such that the adhesive coating unit 20 and the inspection unit 22 respectively move in the X direction and the Y direction with respect to the main substrate 4 aligned therebelow. Thus, the adhesive coating unit 20 can coat the adhesive 7 at an arbitrary point of the main substrate 4, and the adhesive coating unit 20 can inspect the printed state of the cream solder 6 at an arbitrary position of the main substrate 4. In other words, the coating/inspection device M2 has a configuration in which a coating device M2A which coats the adhesive 7 on the main substrate 4 and an inspection device M2B which inspects the printed state of the cream solder 6 printed on the main substrate 4 or the coated state of the adhesive 7 are incorporated into a single device.

Next, the component mounting device M3 will be described with reference to FIGS. 1 and 5. The component mounting device M3 has a function of mounting an electronic component on the main substrate 4 with the cream solder 6 printed thereon. As shown in FIG. 5, a substrate conveying mechanism 3 is provided with a substrate underhung pin 19 which is movable up and down. The lower surface of the main substrate 4 conveyed from the upstream side by the substrate conveying mechanism 3 is underhung by the substrate underhung pin 19. A first component supply section 25A and a second component supply section 25B are provided on both sides of the substrate conveying mechanism 3.

The first component supply section 25A is provided with a plurality of tape feeders 26 arranged in parallel. The tape feeders 26 feed a carrier tape, which stores comparatively small electronic components, such as the chip-type component 8, pitch by pitch by an embedded tape feed mechanism to supply the electronic components to a component extraction position of a first mounting head 23A described below. In the second component supply section 25B, a component tray 27 is arranged which stores comparatively large components, such as the bump-equipped components 9A and 9B with bumps formed in the lower surface, in a predetermined regular arrangement. A second mounting head 23B described below accesses the component storage position of the component tray 27 to extract the electronic components from the component tray 27.

In the end portion of a base 2 in the X direction, a Y-axis table 11 is provided in the Y direction, and a first X-axis table 12A and a second X-axis table 12B are individually mounted on the Y-axis table 11 to be movable in the Y direction. A first mounting head 23A and a second mounting head 23B which respectively include a first absorption nozzle 24A and a second absorption nozzle 24B in the lower end portion are respectively mounted in the first X-axis table 12A and the second X-axis table 12B. The first mounting head 23A absorbs and holds the chip-type component 8 by the first absorption nozzle 24A, and the second mounting head 23B absorbs and holds the bump-equipped component 9A and the bump-equipped component 9B by the second absorption nozzle 24B.

If the Y-axis table 11 is driven, the first X-axis table 12A and the second X-axis table 12B reciprocate individually in the Y direction. The movement in the Y direction and the movement in the X direction by the first X-axis table 12A and the second X-axis table 12B are combined, such that the first mounting head 23A and the second mounting head 23B respectively move freely between the first component supply section 25A and the second component supply section 25B, and the main substrate 4 aligned in the substrate conveying mechanism 3. Thus, the first mounting head 23A mounts the chip-type component 8 extracted from the tape feeder 26 of the first component supply section 25A at an arbitrary mounting position of the main substrate 4 (arrow c). The second absorption nozzle 24B mounts the bump-equipped components 9A and 9B extracted from the component tray 27 of the second component supply section 25B at arbitrary mounting positions of the main substrate 4 (arrow d).

Next, the bonding material supply/substrate mounting device M4 will be described with reference to FIGS. 1 and 6. The bonding material supply/substrate mounting device M4 has a function of supplying a bonding material 10, in which solder particles are contained in thermosetting resin, in a predetermined range on a plurality of connection terminals 4b provided in the main substrate 4 so as to mount the module substrate 5 on the main substrate 4, and a function of mounting the module substrate 5 on the main substrate 4 to land the connection end portion 5d of the module substrate 5 on the connection terminals 4b through the bonding material 10. In other words, the bonding material supply/substrate mounting device M4 has a configuration in which a bonding material supply device M4A supplying the bonding material 10 to the main substrate 4 and a substrate mounting device M4B mounting the module substrate 5 on the main substrate 4 are incorporated into a single device.

In the end portion of a base 2 in the X direction, a Y-axis table 11 is provided in the Y direction, and a first X-axis table 12A and a second X-axis table 12B are individually mounted on the Y-axis table 11 to be movable in the Y direction. As shown in FIG. 6, above a substrate conveying mechanism 3, a bonding material coating unit 30 is provided to be movable in the X direction by the first X-axis table 12A, and a mounting head 32 is provided to be movable in the X direction by the second X-axis table 12B. In the bonding material coating unit 30, a dispenser 31 which includes a coating nozzle 31a in the lower end portion is mounted to be movable up and down.

In a state where the dispenser 31 moves down and the coating nozzle 31a comes close to the upper surface of the main substrate 4, an ejection mechanism embedded in the dispenser 31 is activated, such that the bonding material 10 is ejected from the coating nozzle 31a and coated on the main substrate 4. The bonding material 10 has a composition in which solder particles are contained in thermosetting resin, such as epoxy resin, and an active component having an action to remove an oxide film generated in the surfaces of the solder particles or the connection terminals 4b as a bonding target is mixed.

The mounting head 32 includes an absorption tool 33 having a special shape in the lower end portion, and the absorption tool 33 is configured to absorb and hold the module substrate 5 shown in FIG. 2(b) by two absorption portions 33a and 33b (see FIG. 10(b)). Laterally to the substrate conveying mechanism 3, a substrate supply section 34 is provided in which a substrate storage tray 35 storing the module substrate 5 in a regular arrangement is arranged. The mounting head 32 accesses the substrate supply section 34 to extract the module substrate 5 by the absorption tool 33. In FIG. 6, for convenience, the holding posture of the module substrate 5 by the absorption tool 33 is rotated by 90 degrees around the vertical axis from the actual holding posture.

If the Y-axis table 11 is driven, the first X-axis table 12A and the second X-axis table 12B reciprocate individually in the Y direction. The movement in the Y direction and the movement in the X direction by the first X-axis table 12A and the second X-axis table 12B are combined, such that the bonding material coating unit 30 and the mounting head 32 respectively move in the X direction and the Y direction with respect to the main substrate 4 aligned therebelow. Thus, the bonding material coating unit 30 supplies the bonding material 10 onto the mounting surface 4a formed in the edge portion of the main substrate 4 through coating.

The mounting head 32 can land the connection end portion 5d of the module substrate 5 extracted from the substrate storage tray 35 of the substrate supply section 34 on the connection terminals 4b of the main substrate 4 through the bonding material 10 (arrow e). Although in the example shown in FIG. 6, as the method of supplying the bonding material 10 onto the connection terminals 4b, a method is used in which the bonding material 10 is coated by the bonding material coating unit 30, a method may be used in which the bonding material 10 is molded in advance in a sheet shape and the sheet is attached onto the connection terminals 4b.

Next, the reflow device M5 will be described with reference to FIG. 1. The reflow device M5 has a function of heating the main substrate 4, on which the electronic components, such as the chip-type component 8 and the bump-equipped components 9A and 9B, are mounted and the module substrate 5 is further mounted, to solder-bond the electronic components onto the main substrate 4 and to bond the flexible terminals 5e of the module substrate 5 and the connection terminals 4b of the main substrate 4 together by the bonding material 10. On the main substrate 4, a heating furnace 28 including a heater is arranged, and inside the heating furnace 28, a substrate conveying mechanism 3 is provided to vertically pass through the heating furnace 28 in the X direction. The heating furnace 28 includes a temperature control mechanism. The main substrate 4 with the components mounted thereon carried in the heating furnace 28 is heated in accordance with a predetermined temperature profile while being conveyed to the downstream side by the substrate conveying mechanism 3.

Thus, the cream solder 6 supplied onto the electrodes 4c, 4d, and 4e of the main substrate 4 is molten and solidified, and the terminals 8a of the chip-type component 8 or the bumps 9a of the bump-equipped components 9A and 9B are respectively solder-bonded to the electrodes 4c, 4d, and 4e. Simultaneously, the bonding material 10 is heated, such that electrical conduction is provided between the flexible terminals 5e of the module substrate 5 and the connection terminals 4b of the main substrate 4 by the solder component in the bonding material 10. The thermosetting resin which constitutes the bonding material 10 is also thermally set, such that the connection end portion 5d is fixed to the mounting surface 4a of the main substrate 4.

The electronic component mounting system 1 configured as above is the electronic component mounting system 1 which has a plurality of devices for electronic component mounting connected in series with each other, mounts an electronic component on the main substrate 4 serving as a first substrate, and connects the main substrate 4 and the module substrate 5 serving as a second substrate to each other. The plurality of devices for electronic component mounting which constitute the electronic component mounting system 1 include the solder printing device M1 which prints the cream solder 6 for solder bonding on the main substrate 4, the component mounting device M3 which mounts the electronic component on the main substrate 4 with the cream solder 6 printed thereon, the bonding material supply device M4A which supplies the bonding material 10, in which solder particles are contained in thermosetting resin, to the connection terminals 4b serving as a first connection portion provided in the main substrate 4, the substrate mounting device M4B which mounts the module substrate 5 on the main substrate 4 to land the flexible terminals 5e serving as a second connection portion provided in the module substrate 5 on the connection terminals 4b through the bonding material 10, and the reflow device M5 which heats the main substrate 4 with the electronic component and the module substrate 5 mounted thereon to solder-bond the electronic component onto the main substrate 4 and to bond the flexible terminals 5e and the connection terminals 4b together by the bonding material 10.

Figure 7:
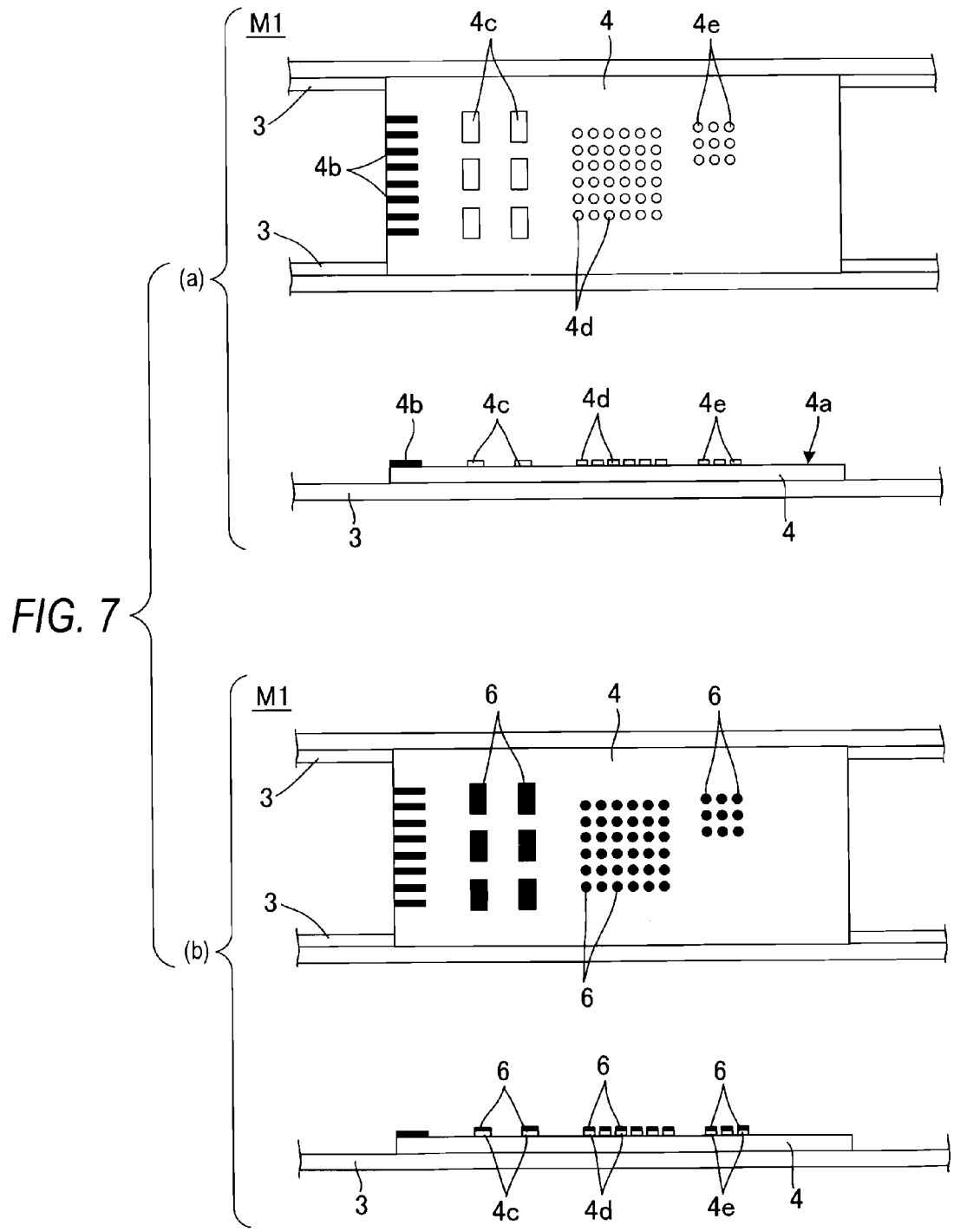
FIGS. 7(a) and (b) are process explanatory views of an electronic component mounting method in the electronic component mounting system according to Embodiment 1 of the invention.
Figure 8:
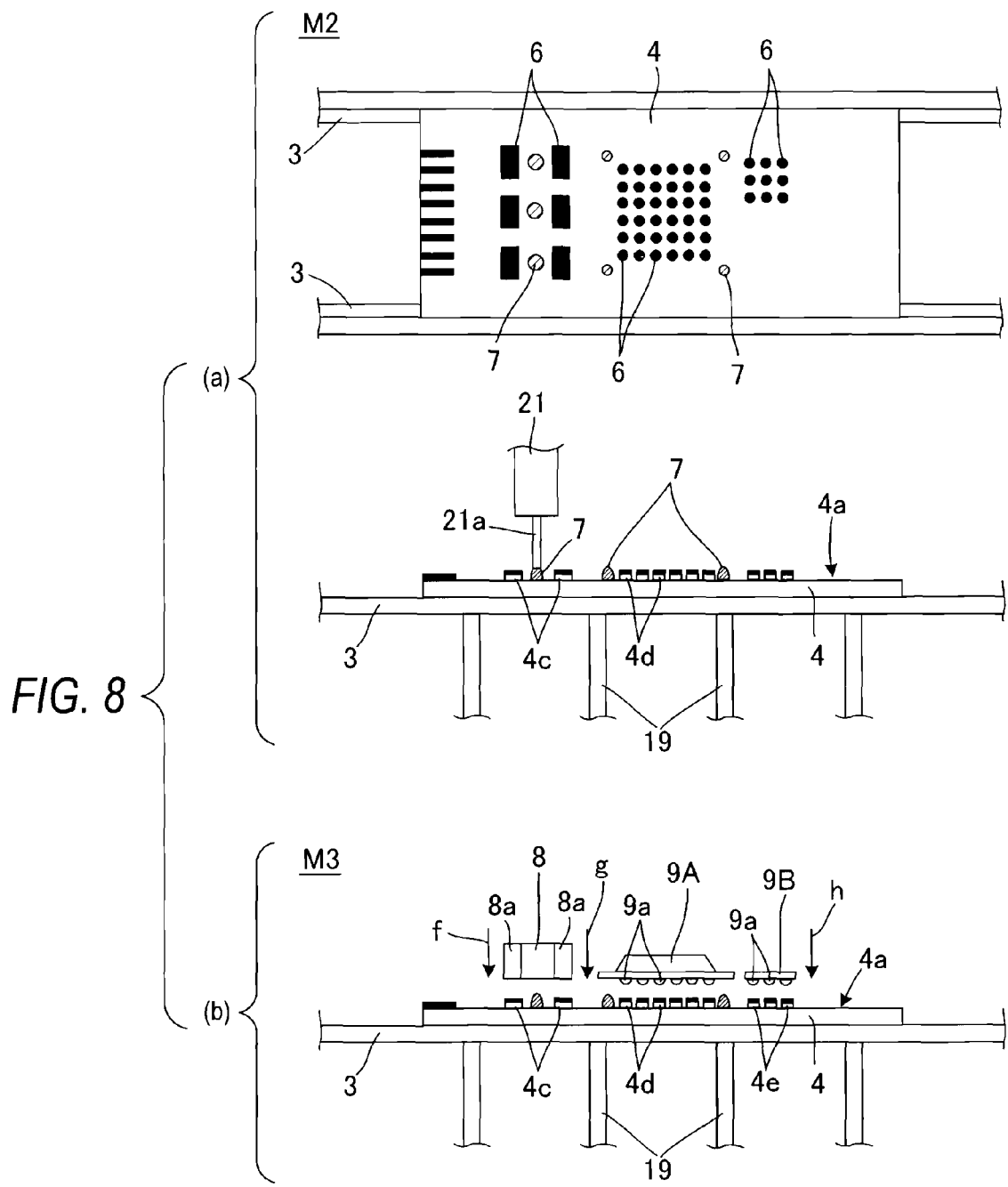
FIGS. 8(a) and (b) are process explanatory views of the electronic component mounting method in the electronic component mounting system according to Embodiment 1 of the invention.

Next, an electronic component mounting method which mounts an electronic component on the main substrate 4 serving as a first substrate and connects the main substrate 4 and the module substrate 5 serving as a second substrate to each other by the electronic component mounting system 1 configured as above will be described with reference to FIGS. 7 to 11. First, FIG. 7(a) shows the main substrate 4 carried in the substrate conveying mechanism 3 of the solder printing device M1. That is, a plurality of connection terminals 4b which are located in one edge portion and used to connect the module substrate 5 are formed in the mounting surface 4a of the main substrate 4, and the electrodes 4c, 4d, and 4e to which the terminals of the electronic component will be connected are formed in the central portion of the mounting surface 4a. Next, the main substrate 4 is carried in the solder printing device M1, and the cream solder 6 for solder bonding is printed on the main substrate 4 (solder printing step). Thus, as shown in FIG. 7(b), the cream solder 6 is supplied onto the upper surfaces of the electrodes 4c, 4d, and 4e at a predetermined thickness.

Next, the main substrate 4 with the solder printed thereon is carried in the coating/inspection device M2, and the adhesive 7 is coated by the adhesive coating unit 20. That is, as shown in FIG. 8(a), the dispenser 21 moves down with respect to the main substrate 4, and the adhesive 7 for temporary component fixing is sequentially coated at a plurality of coating points set in advance by the coating nozzle 21a for each component mounting device. Simultaneously, in the coating/inspection device M2, the main substrate 4 is imaged by the inspection unit 22 to inspect the solder printed state.

Thereafter, the main substrate 4 is carried in the component mounting device M3, and a component mounting operation to mount an electronic component is performed on the main substrate 4 with the cream solder 6 printed thereon by the first mounting head 23A and the second mounting head 23B (component mounting step). That is, as shown in FIG. 8(b), the terminals 8a of the chip-type component 8 move down and are landed on the electrodes 4c (arrow f), the bumps 9a of the bump-equipped component 9A move down and are landed on the electrodes 4d (arrow g), and the bumps 9a of the bump-equipped component 9B move down and are landed on the electrodes 4e (arrow h).

Figure 9:
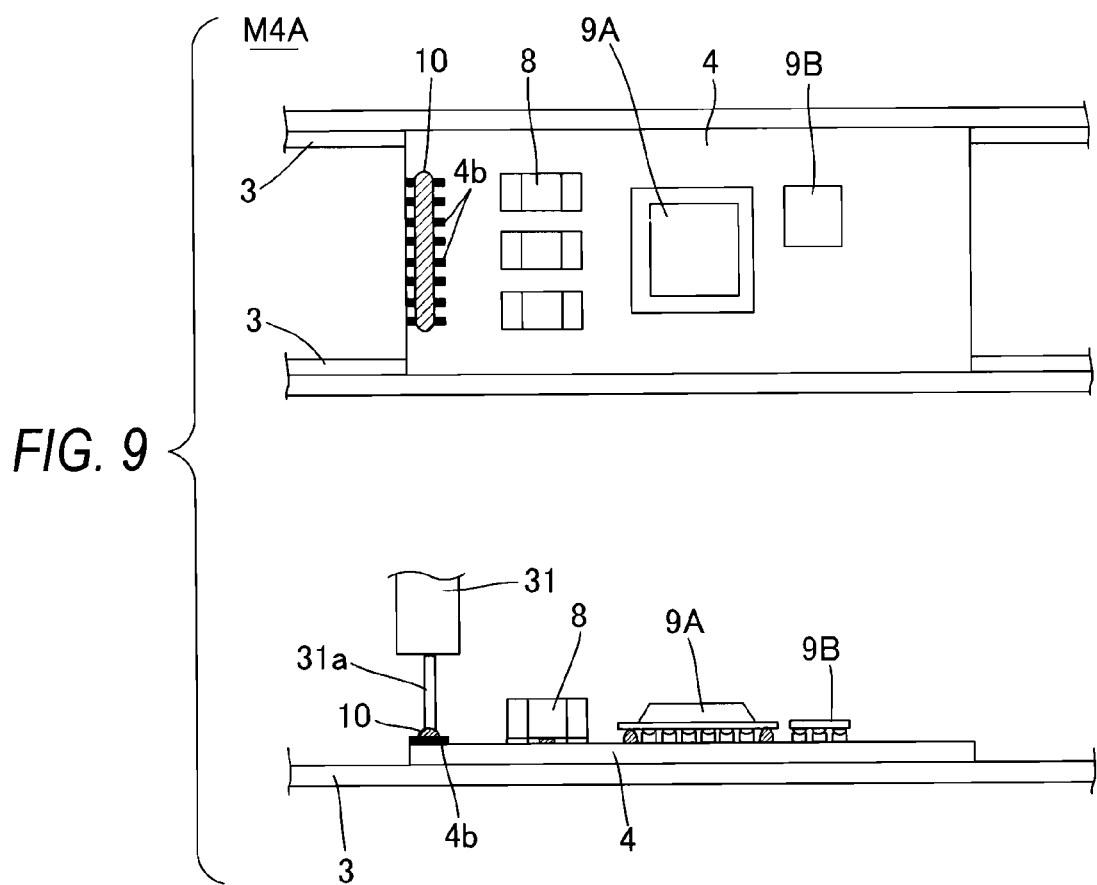
FIG. 9 is a process explanatory view of the electronic component mounting method in the electronic component mounting system according to Embodiment 1 of the invention.
Figure 10:
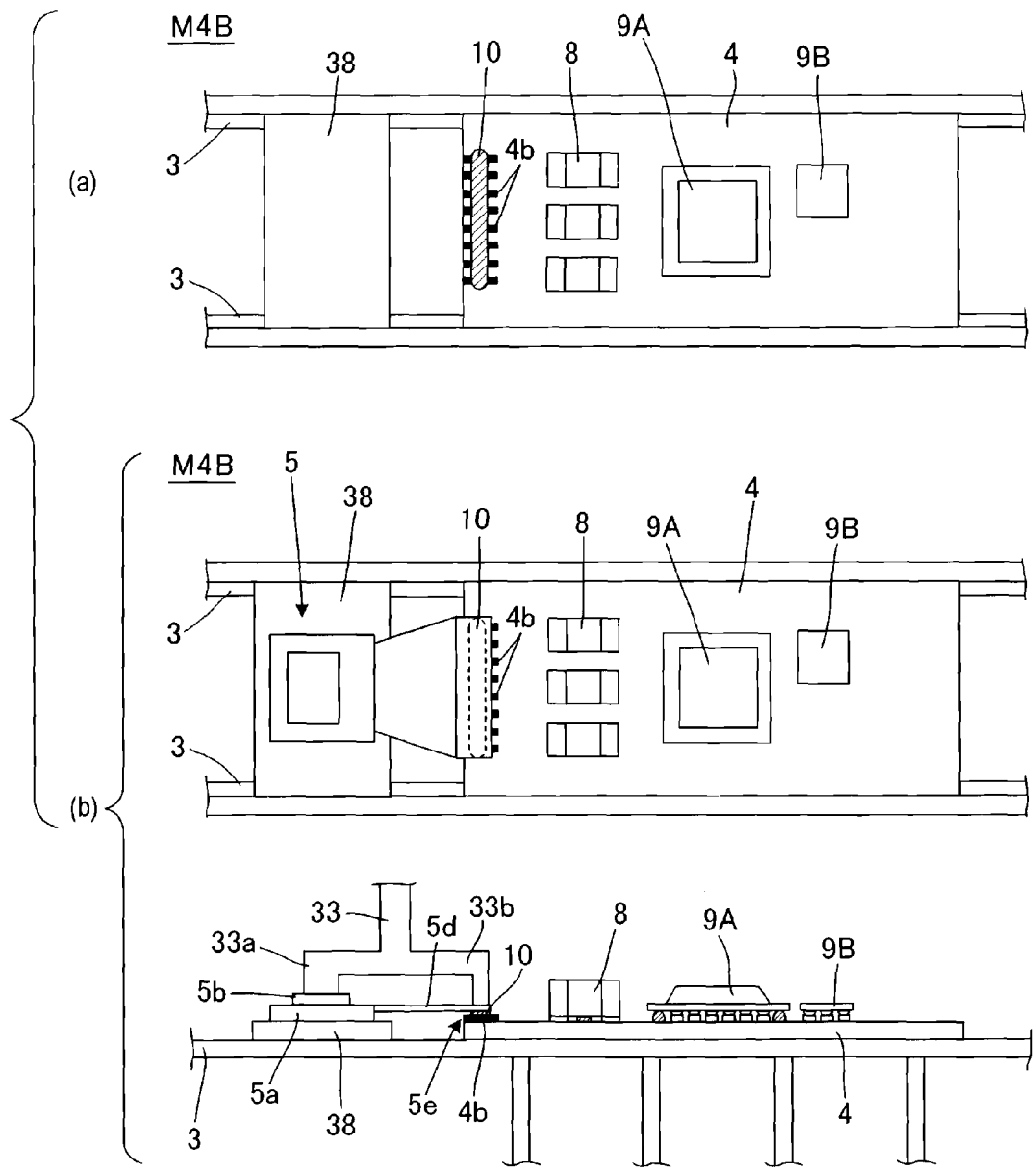
FIGS. 10(a) and (b) are process explanatory views of the electronic component mounting method in the electronic component mounting system according to Embodiment 1 of the invention.

Thereafter, the main substrate 4 with the components mounted thereon is carried in the bonding material supply/substrate mounting device M4. First, the bonding material 10 in which solder particles are contained in thermosetting resin is supplied to the connection terminals 4b of the main substrate 4 serving as a first connection portion to the module substrate 5 by the bonding material supply device M4A (bonding material supply step). That is, as shown in FIG. 9, the bonding material 10 is coated in a predetermined range on the connection terminals 4b of the carried-in main substrate 4. The dispenser 31 moves down above the connection terminals 4b, and then the dispenser 31 moves in the Y direction while the bonding material 10 is being ejected from the coating nozzle 31a, such that the bonding material 10 is coated onto the connection terminals 4b.

Next, the module substrate 5 is mounted on the main substrate 4 by the substrate mounting device M4B to land the flexible terminals Se provided in the module substrate 5 on the connection terminals 4b through the bonding material 10 (substrate mounting step). As shown in FIG. 10(a), first, a holding jig 38 for supporting the sub substrate 5a of the module substrate 5 from below is placed at a position adjacent to the main substrate 4 in the substrate conveying mechanism 3. Next, the module substrate 5 is extracted from the substrate supply section 34 by the absorption tool 33, and as shown in FIG. 10(b), alignment is performed to connect the module substrate 5 to the main substrate 4.

The absorption tool 33 includes two branched absorption portions 33a and 33b, and the electronic component 5b mounted on the sub substrate 5a is absorbed and held by the absorption portion 33a, and the connection end portion of the flexible substrate 5c extending from the sub substrate 5a is absorbed and held by the absorption portion 33b. Thus, it becomes possible to hold the module substrate 5, which has a complex shape and is not easily held stably by a normal method, in a correct posture.

With regard to the alignment of the main substrate 4 and the module substrate 5, the sub substrate 5a absorbed and held by the absorption portion 33a is placed on the holding jig 38, and the connection end portion 5d absorbed and held by the absorption portion 33b is landed on the connection terminals 4b through the bonding material 10. Thus, the flexible terminals 5e (FIG. 2) formed in the lower surface of the connection end portion 5d come close to the surfaces of the connection terminals 4b. At this time, it is preferable that the absorption tool 33 is pressed against the main substrate 4 to push the connection end portion 5d against the connection terminals 4b. An absorption tool having a heating function is used as the absorption tool 33 to heat the solder component in the bonding material 10, thereby improving wettability to the connection terminals 4b or the flexible terminals 5e.

Thereafter, the main substrate 4 with the electronic components and the module substrate 5 mounted thereon is carried in the reflow device M5. As shown in FIG. 11, the main substrate 4 with the electronic components, such as the chip-type component 8 and the bump-equipped components 9A and 9B, and the module substrate 5 mounted thereon is heated to solder-bond the electronic components onto the main substrate 4 and to bond the flexible terminals 5e of the module substrate 5 and the connection terminals 4b of the main substrate 4 together by the bonding material 10 (reflow step). Thus, the terminals 8a of the chip-type component 8 are solder-bonded to the electrodes 4c, and the bumps 9a of the bump-equipped components 9A and 9B are respectively solder-bonded to the electrodes 4d and 4e.

Simultaneously, the bonding material 10 is heated, such that the solder component contained in the bonding material 10 is molten to provide electrical conduction between the connection terminals 4b and the flexible terminals 5e, and thermosetting resin which constitutes the bonding material 10 is thermally set to fix the connection end portion 5d to the mounting surface 4a of the main substrate 4. Thus, the flexible terminals 5e and the connection terminals 4b are bonded together by the bonding material 10. At this time, with the action of the active component mixed in the bonding material 10, an oxide film generated in the surfaces of the solder particles or the connection terminals 4b as a bonding target is removed, thereby ensuring satisfactory solder bondability.

FIG. 12 shows an example of a preferred temperature profile in the reflow step. First, at a preliminary heating time t1 for which the main substrate 4 and the module substrate 5 are moving in a preliminary heating zone of the heating furnace 28, the temperature of each of the main substrate 4 and the module substrate 5 is maintained at a preliminary heating temperature T1 (120° C. to 160° C.) set in advance. With the preliminary heating, moisture desorption of the main substrate 4 is performed to remove moisture which adversely affects connection quality, to develop the activation action of the active component mixed in the bonding material 10, and to promote the removal of the oxide film in the surfaces of the solder particles or the connection terminals 4b as a bonding target.

Next, the main substrate 4 further moves in the heating furnace 28 and reaches a regular heating zone, such that the temperature of each of the main substrate 4 and the module substrate 5 is maintained at a regular heating temperature T2 (230° C. to 260° C.) set in advance. With the regular heating, the cream solder 6 or the solder component in the bonding material 10 is molten, and solder bonding for bonding the electronic components to the respective electrodes of the main substrate 4 or solder bonding for providing electrical conduction between the connection terminals 4b and the flexible terminals 5e is performed. The thermosetting reaction of thermosetting resin in the bonding material 10 progresses, and the fixing of the connection end portion 5d to the main substrate 4 is completed.

Although in Embodiment 1, as the support method of conveying the main substrate 4 and the module substrate 5 after being connected to each other as a single body by the substrate conveying mechanism 3, as shown in FIG. 11, an example has been described in which the holding jig 38 for holding the sub substrate 5a of the module substrate 5 from below separately from the main substrates 4 from below is used, various methods may be used with regard to the configuration for supporting the main substrate 4 and the module substrate 5 as a single body.

For example, in an example shown in FIG. 13(a), an example is described in which a substrate carrier 39 accommodating and holding the main substrate 4 and the module substrate 5 as a single body is used. That is, the substrate carrier 39 substantially having a rectangular block shape is provided with concave portions 39a and 39b which are shaped such that the main substrate 4 and the module substrate 5 are engaged therewith from the upper surfaces. In a state where the main substrate 4 and the module substrate 5 are respectively engaged with the concave portions 39a and 39b, the connection end portion 5d of the module substrate 5 is correctly located on the connection terminals 4b of the main substrate 4. In the bonding material supply/substrate mounting device M4, after the module substrate 5 is mounted, the main substrate 4 and the module substrate 5 are conveyed along with the substrate carrier 39, and in this state, heating in the reflow device M5 is performed.

In an example shown in FIG. 13(b), an example is described in which the main substrate 4 is conveyed by the substrate conveying mechanism 3 in a state where the module substrate 5 overlaps the upper surface of the main substrate 4. That is, a placing jig 40 which substantially has a gate-type section and can be placed on the main substrate 4 to cover the upper surface of the bump-equipped component 9A or the chip-type component 8 mounted on the main substrate 4 is used as a jig for holding the module substrate 5. The module substrate 5 is mounted on the main substrate 4 in a state where the sub substrate 5a is placed on the upper surface of the placing jig 40 placed on the upper surface of the main substrate 4 to cover the electronic components. The placing jig 40 is removed after the connection of the connection terminals 4b and the connection end portion 5d ends.

(Embodiment 2)

Figure 14:
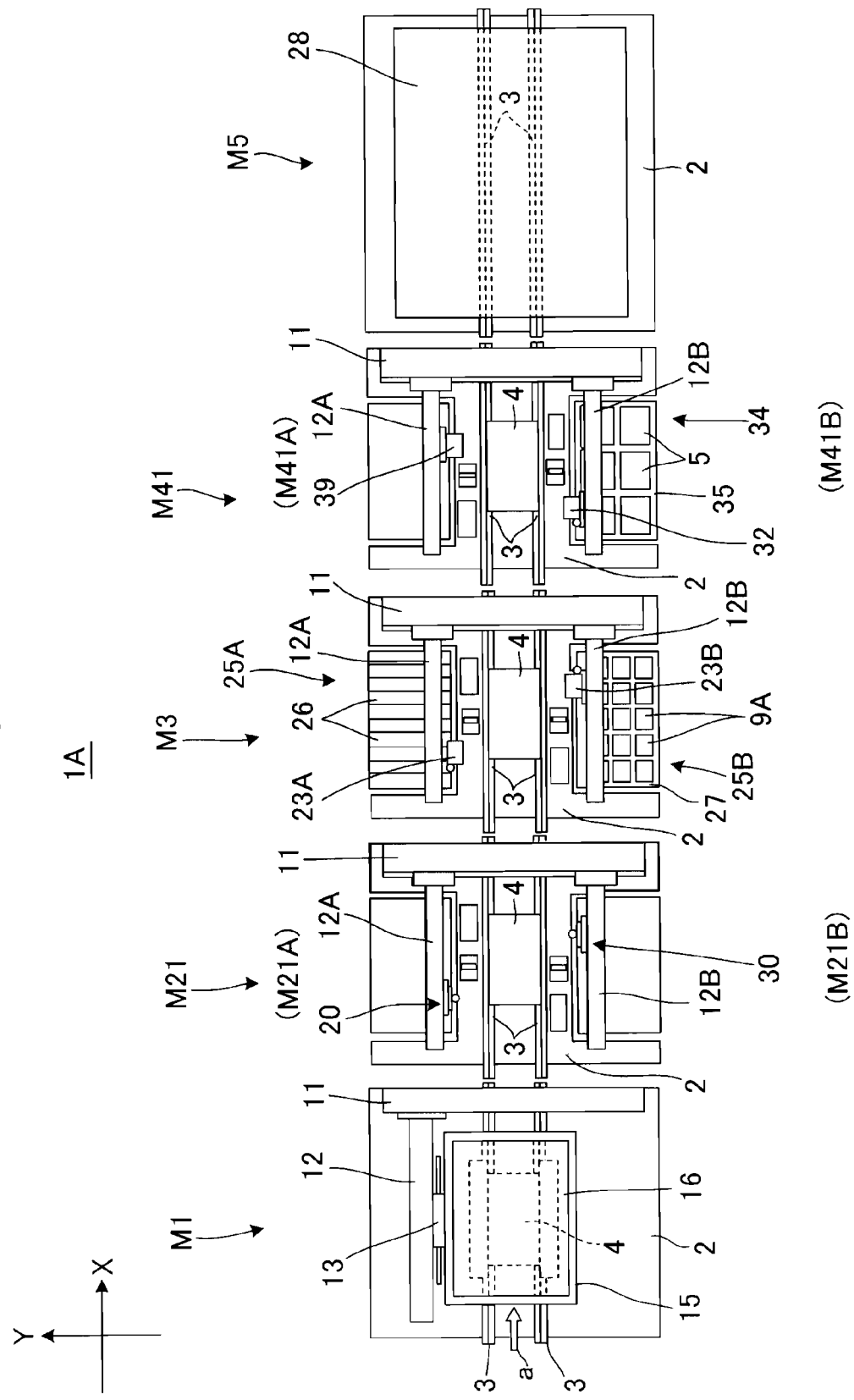
FIG. 14 is a plan view showing the configuration of an electronic component mounting system according to Embodiment 2 of the invention.

FIG. 14 is a plan view showing the configuration of an electronic component mounting system according to Embodiment 2 of the invention.

Figure 15:
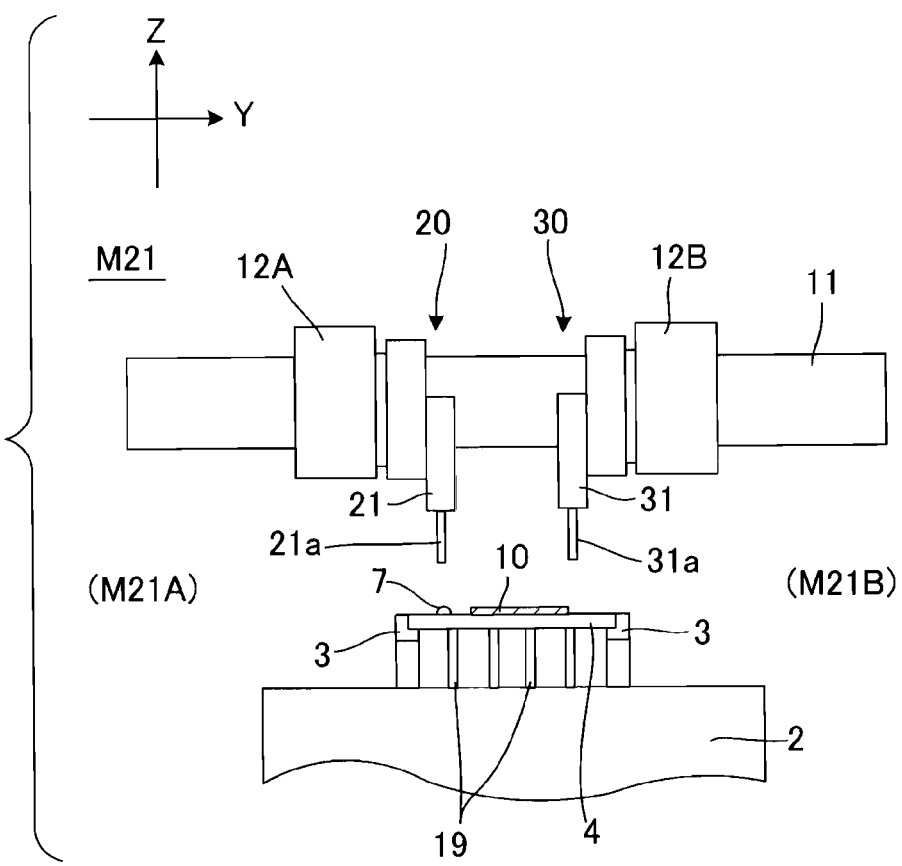
FIG. 15 is a partial sectional view of an adhesive coating/bonding material supply device which constitutes the electronic component mounting system according to Embodiment 2 of the invention.
Figure 16:
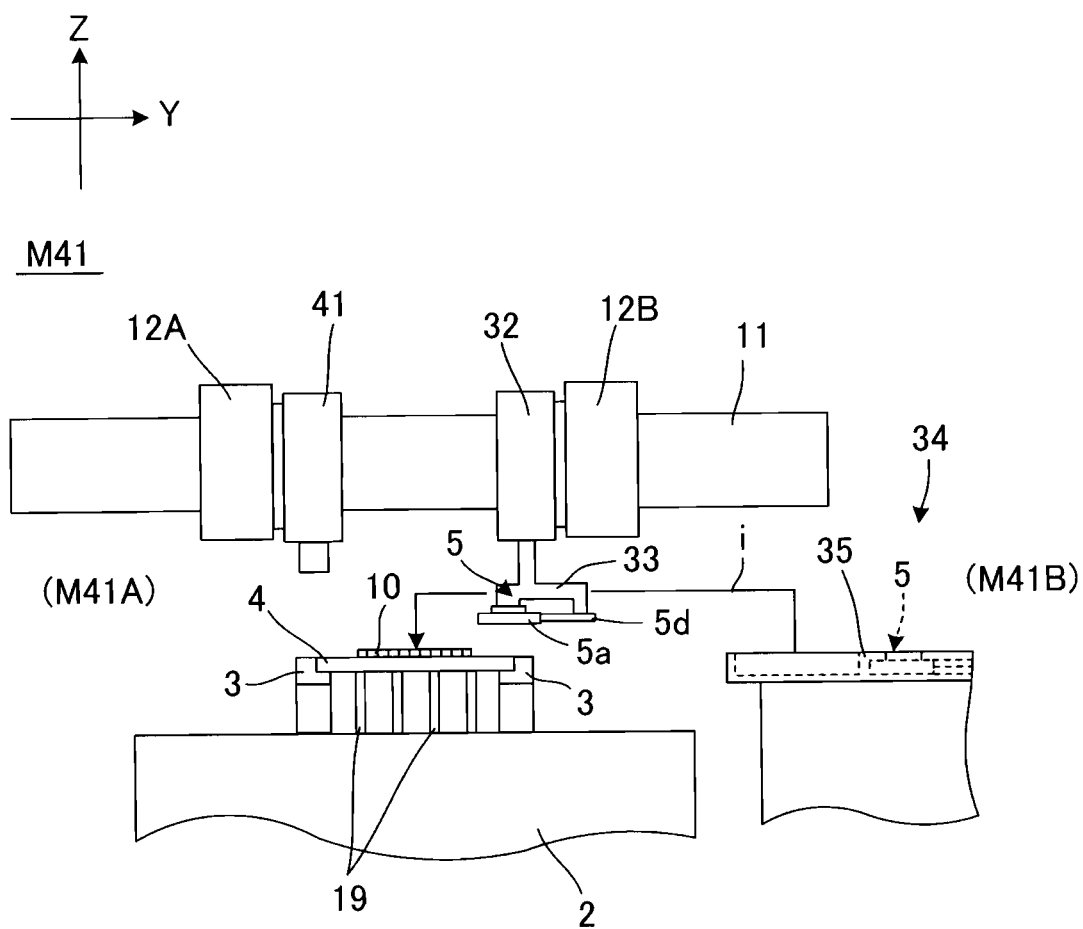
FIG. 16 is a partial sectional view of an inspection/substrate mounting device which constitutes the electronic component mounting system according to Embodiment 2 of the invention.
Figure 17:
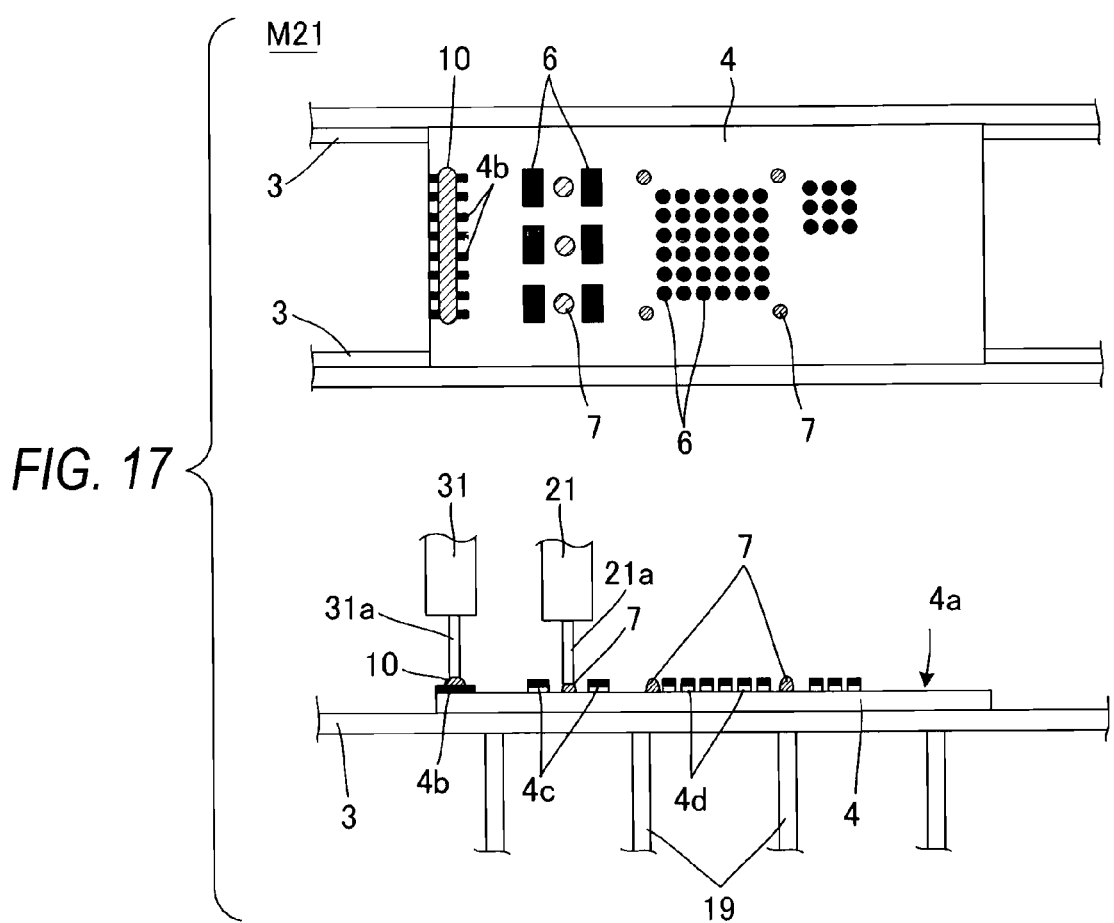
FIG. 17 is a process explanatory view of an electronic component mounting method in the electronic component mounting system according to Embodiment 2 of the invention.
Figure 18:
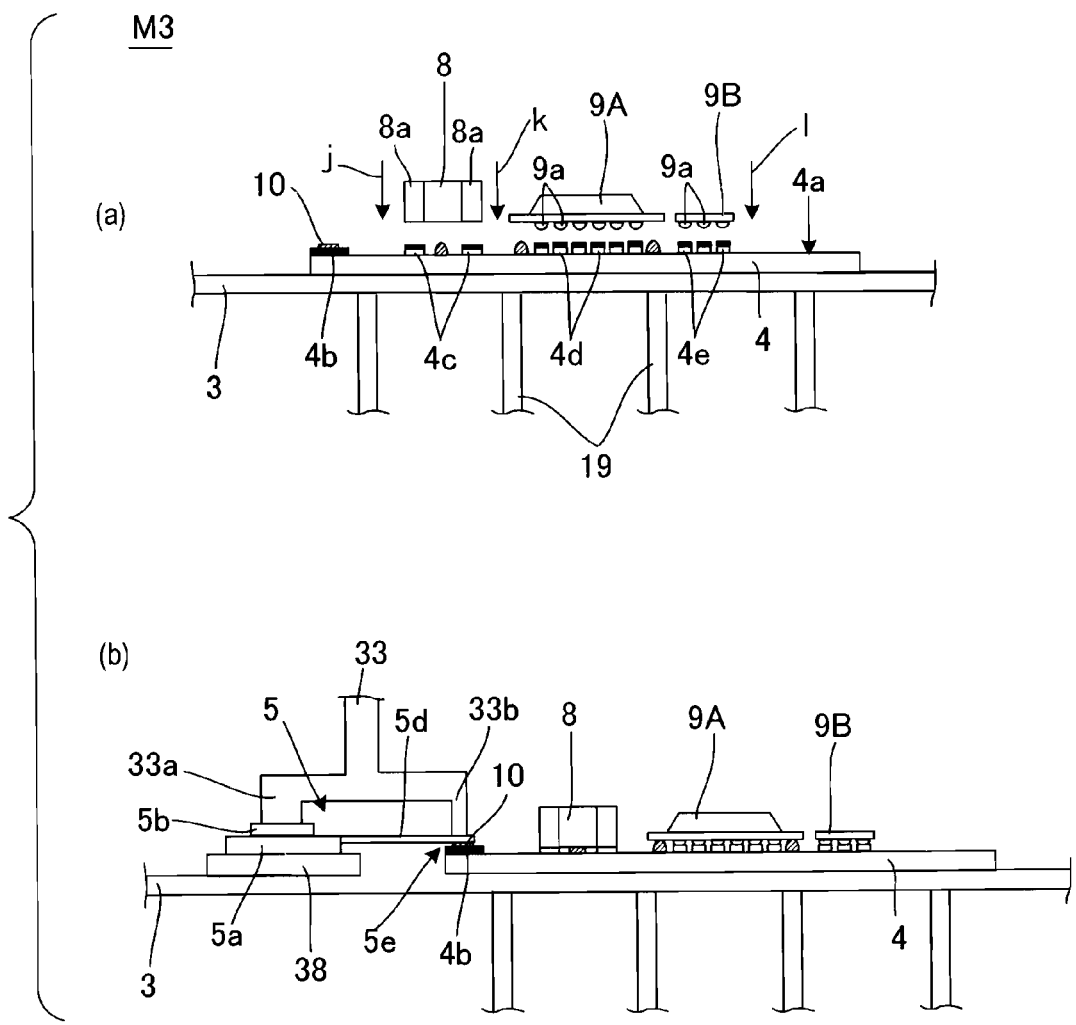
FIGS. 18(a) and (b) are process explanatory views of the electronic component mounting method in the electronic component mounting system according to Embodiment 2 of the invention.
Figure 19:
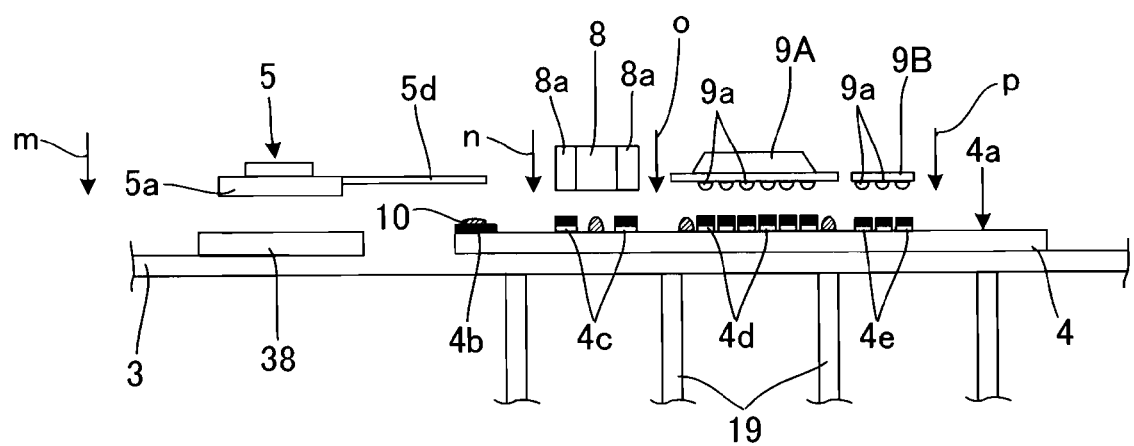
FIG. 19 is a process explanatory view of the electronic component mounting method in the electronic component mounting system according to Embodiment 2 of the invention.

FIG. 15 is a partial sectional view of an adhesive coating/bonding material supply device which constitutes the electronic component mounting system according to Embodiment 2 of the invention. FIG. 16 is a partial sectional view of an inspection/substrate mounting device which constitutes the electronic component mounting system according to Embodiment 2 of the invention. FIGS. 17, 18, and 19 are process explanatory views of an electronic component mounting method in the electronic component mounting system according to Embodiment 2 of the invention.

While in Embodiment 1, the supply of the bonding material 10 is performed after the electronic components are mounted on the main substrate 4, in Embodiment 2, a process sequence is changed such that the supply of the bonding is performed before the electronic components are mounted. In FIG. 14, an electronic component mounting system 1A includes a solder printing device M1, an adhesive coating/bonding material supply device M21, a component mounting device M3, an inspection/substrate mounting device M41, and a reflow device M5 connected in series with each other as a plurality of devices for electronic component mounting. Each device includes a substrate conveying mechanism 3 which is arranged in the X direction (substrate conveying direction) in the central portion of a base 2, and the substrate conveying mechanism 3 of each device is connected in series with the substrate conveying mechanism 3 of an adjacent device to form a substrate conveying path which passes through the electronic component mounting system 1A vertically. A main substrate 4 on which an electronic component will be mounted is carried in the substrate conveying mechanism 3 of the solder printing device M1 from the upstream side (the left side of FIG. 1, see arrow a) and sequentially conveyed in the X direction inside the electronic component mounting system 1A.

In the above-described configuration, the solder printing device M1, the component mounting device M3, and the reflow device M5 are the same as those in the electronic component mounting system 1 of Embodiment 1. The adhesive coating/bonding material supply device M21 has a configuration in which an adhesive coating device M21A and a bonding material supply device M21B having the same functions as the adhesive coating device M21A and the bonding material supply device M4A in the electronic component mounting system 1 are incorporated in a single device.

The adhesive coating/bonding material supply device M21 will be described with reference to FIGS. 14 and 15. In the end portion of a base 2 in the X direction, a Y-axis table 11 is arranged in the Y direction, and a first X-axis table 12A and a second X-axis table 12B are individually mounted on the Y-axis table 11 to be movable in the Y direction. Above the substrate conveying mechanism 3 are provided an adhesive coating unit 20 which is movable in the X direction by the first X-axis table 12A and a bonding material coating unit 30 which is movable in the X direction by the second X-axis table 12B. In the adhesive coating unit 20, a dispenser 21 having a coating nozzle 21a in the lower end portion is mounted to be movable up and down. In the bonding material coating unit 30, a dispenser 31 having a coating nozzle 31a in the lower end portion is mounted to be movable up and down.

In a state where the dispenser 21 moves down and the coating nozzle 21a comes close to the upper surface of the main substrate 4, an ejection mechanism embedded in the dispenser 21 is activated, such that an adhesive 7 for temporary component fixing is ejected from the coating nozzle 21a and coated on the main substrate 4. In a state where the dispenser 31 moves down and the coating nozzle 31a comes close to the upper surface of the main substrate 4, an ejection mechanism embedded in the dispenser 31 is activated, such that a bonding material 10 is ejected from the coating nozzle 31a and coated on the main substrate 4.

Next, the inspection/substrate mounting device M41 will be described with reference to FIGS. 14 and 16. The inspection/substrate mounting device M41 has a configuration in which an inspection device M41A inspecting the main substrate 4 with the components mounted thereon and a substrate mounting device M41B mounting the module substrate 5 on the main substrate 4 are incorporated in a single device. The substrate mounting device M41B has the same configuration as the substrate mounting device M4B in the bonding material supply/substrate mounting device M4 of the electronic component mounting system 1 described in Embodiment 1.

In the end portion of a base 2 in the X direction, a Y-axis table 11 is arranged in the Y direction, and a first X-axis table 12A and a second X-axis table 12B are individually mounted on the Y-axis table 11 to be movable in the Y direction. In the first X-axis table 12A and the second X-axis table 12B, an inspection unit 41 and a mounting head 32 are mounted to be movable in the X direction. The inspection unit 41 has a function of imaging the main substrate 4 therebelow, and performs recognition processing on the imaging result by a recognition processing section (not shown) to inspect the mounted state of the electronic components mounted in the main substrate 4.

The substrate mounting device M41B includes the same mounting head 32 as the substrate mounting device M4B in Embodiment 1. The mounting head 32 accesses a substrate supply section 34 to extract the module substrate 5 by an absorption tool 33. In FIG. 16, as in FIG. 6, for convenience, the holding posture of the module substrate 5 by the absorption tool 33 is rotated by 90 degrees around the vertical axis from the actual holding posture.

The electronic component mounting system 1A configured as above is the electronic component mounting system which has a plurality of devices for electronic component mounting connected in series with each other, mounts an electronic component on the main substrate 4 serving as a first substrate, and connects the main substrate 4 and the module substrate 5 serving as a second substrate. A plurality of devices for electronic component mounting which constitute the electronic component mounting system 1A include the solder printing device M1 which prints the cream solder 6 for solder bonding on the main substrate 4, the bonding material supply device M21B which supplies the bonding material 10, in which solder particles are contained in thermosetting resin, to the connection terminals 4*b* serving as a first connection portion provided in the main substrate 4 with the cream solder 6 printed thereon, the component mounting device M3 which mounts the electronic component on the main substrate 4 with the cream solder 6 printed thereon, the substrate mounting device M41B which mounts the module substrate 5 on the main substrate 4 to land the flexible terminals 5*e* serving as a second connection portion provided in the module substrate 5 on the connection terminals 4*b* through the bonding material 10, and the reflow device M5 which heats the main substrate 4 with the electronic component and the module substrate 5 mounted thereon to solder-bond the electronic component onto the main substrate 4 and to bond the flexible terminals 5*e* and the connection terminals 4*b* together by the bonding material 10.

Next, an electronic component mounting method which mounts an electronic component on the main substrate 4 serving as a first substrate and connects the main substrate 4 and the module substrate 5 serving as a second substrate to each other by the electronic component mounting system 1A will be described. After the solder printing step shown in FIG. 7 in Embodiment 1 is performed on the main substrate 4, as shown in FIG. 17, the main substrate 4 is carried in the adhesive coating/bonding material supply device M21. Thus, the coating of the adhesive 7 for temporary component fixing by the dispenser 21 of the adhesive coating unit 20 and the supply of the bonding material 10 for substrate bonding by the dispenser 31 of the bonding material coating unit 30 are performed on the main substrate 4.

Thereafter, component mounting and substrate mounting are sequentially performed. That is, the main substrate 4 which is subjected to the coating of the adhesive 7 and the supply of the bonding material 10 is carried in the component mounting device M3, and the chip-type component 8 and the bump-equipped components 9A and 9B are mounted on the main substrate 4 (component mounting step). That is, as shown in FIG. 18(*a*), the terminals 8*a* of the chip-type component 8 move down and are landed on the electrodes 4*c* (arrow j), the bumps 9*a* of the bump-equipped component 9A move down and are landed on the electrodes 4*d* (arrow k), and the bumps 9*a* of the bump-equipped component 9B move down and are landed on the electrodes 4*e* (arrow 1). Next, the main substrate 4 is carried in the inspection/substrate mounting device M41, and as shown in FIG. 18(*b*), the module substrate 5 is mounted on the main substrate 4 by the substrate mounting device M41B. That is, the module substrate 5 is held by the absorption tool 33 of the mounting head 32, and the sub substrate 5*a* is placed on the holding jig 38 placed in advance on the substrate conveying mechanism 3 to land the flexible terminals 5*e* provided in the module substrate 5 on the connection terminals 4*b* through the bonding material 10 (substrate mounting step).

Next, the main substrate 4 with the module substrate 5 connected thereto is carried in the reflow device M5, and as in FIG. 11 of Embodiment 1, the main substrate 4 with the electronic components, such as the chip-type component 8 and the bump-equipped components 9A and 9B, and the module substrate 5 mounted thereon is heated to solder-bond the electronic component onto the main substrate 4 and to bond the flexible terminals 5*e* of the module substrate 5 and the connection terminals 4*b* of the main substrate 4 together by the bonding material 10 (reflow step). Thus, the terminals 8*a* of the chip-type component 8 are solder-bonded to the electrodes 4*c*, and the bumps 9*a* of the bump-equipped components 9A and 9B are respectively solder-bonded to the electrodes 4*d* and 4*e*.

Simultaneously, the bonding material 10 is heated, such that the solder component in the bonding material 10 is molten to provide electrical conduction between the connection terminals 4*b* and the flexible terminals 5*e*, and thermosetting resin which constitutes the bonding material 10 is thermally set to fix the connection end portion 5*d* to the mounting surface 4*a* of the main substrate 4. Thus, the flexible terminals 5*e* and the connection terminals 4*b* are bonded together by the bonding material 10.

Although in the above-described embodiment, an example has been described in which the component mounting device M3 and the inspection/substrate mounting device M41 are individually arranged in the electronic component mounting system 1A, the component mounting step is first performed by the component mounting device M3, and then the substrate mounting step is performed by the substrate mounting device M41B in the inspection/substrate mounting device M41, the functions of the component mounting device M3 and the substrate mounting device M41B may be united in a single device as an equipment configuration. For example, when the number of electronic components which are mounted on the main substrate 4 is small, and there is a room in the mounting function, the mounting of the electronic components and the mounting of the module substrate 5 on the main substrate 4 can be performed in the same step by a single mounting device. That is, in this case, the electronic component mounting system 1A includes the mounting device which mounts the electronic component on the main substrate 4 with the cream solder 6 printed thereon and the bonding material 10 supplied thereto and also mounts the module substrate 5 on the main substrate 4 to land the flexible terminals 5*e* provided in the module substrate 5 on the connection terminals 4*b* through the bonding material 10.

With this equipment configuration, the mounting of the electronic component and the mounting of the module substrate 5 are performed in the same mounting step on the main substrate 4 shown in FIG. 17 subjected to the coating of the adhesive 7 for temporary component fixing and the supply of the bonding material 10 for substrate bonding to the main substrate 4. That is, the main substrate 4 is carried in the mounting device in which the functions of the component mounting device M3 and the substrate mounting device M41B are united. As shown in FIG. 19, the terminals 8*a* of the chip-type component 8 move down and are landed on the electrodes 4c (arrow n), the bumps 9a of the bump-equipped component 9A move down and are landed on the electrodes 4d (arrow o), the bumps 9a of the bump-equipped component 9B move down and are landed on the electrodes 4e (arrow p), and the module substrate 5 is mounted on the main substrate 4 to land the flexible terminals 5e provided in the module substrate 5 on the connection terminals 4b through the bonding material 10 (arrow m) (mounting step).

As described above, in the electronic component mounting system described in Embodiment 1 and Embodiment 2, the electronic component mounting method is performed which mounts the electronic component on the main substrate 4 serving as a first substrate, and connects the main substrate 4 and the module substrate 5 serving as a second substrate to each other. In the electronic component mounting method, the cream solder 6 is first printed on the main substrate 4 to mount an electronic component, and the bonding material 10 in which solder particles are contained in thermosetting resin is supplied to the connection terminals 4b serving as a first connection portion provided in the main substrate 4 to land the flexible terminals 5e serving as a second connection portion provided in the module substrate 5 on the connection terminals 4b through the bonding material 10. Thereafter, the main substrate 4 with the electronic component and the main substrate 4 mounted thereon is heated in the same reflow step to solder-bond the electronic component onto the main substrate 4 and to bond the flexible terminals 5e and the connection terminals 4b together by the bonding material 10.

Therefore, it becomes possible to reduce the space occupied by equipment and equipment cost compared to a production line having a related art configuration in which a component mounting line for mounting an electronic component on the main substrate 4 and a substrate connection line for connecting the main substrate 4 with the electronic component mounted thereon to the module substrate 5 are separated from each other. With regard to the main substrate 4 with the electronic component and the module substrate 5 mounted thereon, the solder bonding of the electronic component and the bonding of the flexible terminals 5e and the connection terminals 4b are completed in the same reflow step, thereby eliminating the following problems in the related art method.

That is, when the component mounting line and the substrate connection line are separated from each other, the main substrate 4 with the component mounted thereon is stacked until the main substrate 4 is conveyed to the substrate connection line, and during the stacking time, the main substrate 4 inevitably absorbs moisture and contains moisture. In the substrate connection step, the moisture is evaporated, causing a problem in that a void is generated in the connection portion. In contrast, in this embodiment, since the connection of the main substrate 4 and the module substrate 5 is performed in the same reflow step as the solder bonding of the electronic component, the problems in the related art method are excluded, thereby ensuring high connection reliability.

Although the invention has been described in detail or with reference to the specific embodiments, it should be apparent to those skilled in the art that various changes or alterations may be made without departing from the spirit and scope of the invention.

This application is based on Japanese Patent Application No. 2009-092617, filed on Apr. 7, 2009, the content of which is incorporated herein by reference.

Industrial Applicability

The electronic component mounting system and the electronic component mounting method of the invention have an advantage of ensuring high connection reliability, and it is useful in an electronic component mounting system which has a plurality of devices for electronic component mounting connected in series with each other, mounts an electronic component on a first substrate, and connects the first substrate and a second substrate to each other.

REFERENCE SIGNS LIST 1, 1A: electronic component mounting system
3: substrate conveying mechanism
4: main substrate (first substrate)
4b: connection terminal (first connection portion)
5: module substrate (second substrate)
5a: sub substrate
5c: flexible substrate
5e: flexible terminal (second connection portion)
6: cream solder (paste)
8: chip-type component (electronic component)
9A, 9B: bump-equipped component (electronic component)
10: bonding material
30: bonding material coating unit
32: mounting head
M1: solder printing device
M2: coating/inspection device
M2A: bonding material supply device
M3: component mounting device
M4: bonding material supply/substrate mounting device
M4A: bonding material supply device
M4B: substrate mounting device
M5: reflow device
M21: adhesive coating and bonding material supply device
M21A: adhesive coating device
M21B: bonding material supply device
M41: inspection/substrate mounting device
M41B: substrate mounting device

The invention claimed is:

1. An electronic component mounting method which mounts an electronic component on a first substrate and connects the first substrate and a second substrate to each other, the method comprising:
a solder printing step of printing paste for solder bonding on the first substrate;
a component mounting step of mounting the electronic component on the first substrate with the paste printed thereon;
a bonding material supply step of supplying a bonding material, in which solder particles are contained in thermosetting resin, to a first connection portion provided in the first substrate;
a substrate mounting step of mounting the second substrate on the first substrate to land a second connection portion provided in the second substrate on the first connection portion through the bonding material, and
a reflow step of heating the first substrate with the electronic component and the second substrate mounted thereon to solder-bond the electronic component onto the first substrate and to bond the second connection portion and the first connection portion together by the bonding material.

2. An electronic component mounting method which mounts an electronic component on a first substrate and connects the first substrate and a second substrate to each other, the method comprising:
a solder printing step of printing paste for solder bonding on the first substrate;

a bonding material supply step of supplying a bonding material, in which solder particles are contained in thermosetting resin, to a first connection portion provided in the first substrate after the paste is printed;

a component mounting step of mounting the electronic component on the first substrate with the bonding material supplied thereto;

a substrate mounting step of mounting the second substrate on the first substrate to land a second connection portion provided in the second substrate on the first connection portion through the bonding material; and a reflow step of heating the first substrate with the electronic component and the second substrate mounted thereon to solder-bond the electronic component onto the first substrate and to bond the second connection portion and the first connection portion together by the bonding material.

3. An electronic component mounting method which mounts an electronic component on a first substrate and connects the first substrate and a second substrate to each other, the method comprising:

a solder printing step of printing paste for solder bonding on the first substrate;

a bonding material supply step of supplying a bonding material, in which solder particles are contained in thermosetting resin, to a first connection portion provided in the first substrate after the paste is printed;

a mounting step of mounting the electronic component on the first substrate with the paste for solder bonding printed thereon and the bonding material supplied thereto and mounting the second substrate on the first substrate to land a second connection portion provided in the second substrate on the first connection portion through the bonding material; and a reflow step of heating the first substrate with the electronic component and the second substrate mounted thereon to solder-bond the electronic component onto the first substrate and to bond the second connection portion and the first connection portion together by the bonding material.

* * * * *